United States Patent [19]
Yamaguchi et al.

[11] Patent Number: 5,802,855
[45] Date of Patent: Sep. 8, 1998

[54] POWER LEAD FOR ELECTRICALLY CONNECTING A SUPERCONDUCTING COIL TO A POWER SUPPLY

[76] Inventors: Sataro Yamaguchi, 18-17 Kanokoden, Chikusa-ku, Nagoya, Aichi; Kiyoshi Takita, c/o Fuji Electric Co., Ltd. 1-1, Tanabeshinden, Kawasaki-ku, Kawasaki, Kanagawa 210; Ikuo Itoh, c/o Fuji Electric Co., Ltd. 1-1, Tanabeshinden, Kawasaki-ku, Kawasaki, Kanagawa 210; Hisaaki Hiue, c/o Fuji Electric Co., Ltd. 1-1, Tanabeshinden, Kawasaki-ku, Kawasaki, Kanagawa 210; Shinichi Nose, c/o Fuji Electric Co., Ltd. 1-1, Tanabeshinden, Kawasaki-ku, Kawasaki, Kanagawa 210, all of Japan

[21] Appl. No.: 560,951

[22] Filed: Nov. 20, 1995

[30] Foreign Application Priority Data

Nov. 21, 1994 [JP] Japan .................... 6-309416

[51] Int. Cl.$^6$ .................... F25B 21/02
[52] U.S. Cl. .............. 62/3.2; 62/3.7; 505/700; 505/704; 505/706; 505/891
[58] Field of Search .............. 62/3.2, 3.3, 3.7; 505/888, 891, 700, 701, 704, 706, 100, 900, 899

[56] References Cited

U.S. PATENT DOCUMENTS 4,819,011   4/1989   Yokota .................... 62/3.2

OTHER PUBLICATIONS

T. Motono et al., "Studies in thermoelectric cooling at lower than 200K (I)," Abstract extended in Autumn Meeting, Association of Low Temperature Engineering and Superconductor Physics, C1–15, p. 34, 1990.

Japanese Patent Kokai Publication JP–A–Hei–6–314612; Published on Nov. 8, 1994.

T. Fujioka, "Power Lead," Industrial materials, vol. 41, No. 3, pp. 32–37, Mar. 1993.

T. Nakano et al., "New Type Peltier Refrigerator for Low Temperatures Using a High–$T_c$ Superconductor," Low Temperature Engineering, vol. 29, No. 1, pp. 12–18, 1944.

T. Nakano et al., "Peltier Refrigeration Employing High–Temperature Superconductor (Thermoelectric Cooling)," Abstract extended in Associate of Low Temperature Engineering and Superconductor Physics, Autumn Meeting, C–3–15, p. 270.

T. Nakano et al., "Thermoelectric cooling in liquid nitrogen temperature range," Abstract extended in Association of Low Temperature Engineering and Superconductor Physics, Autumn Meeting, B3–11, p. 277.

Yokoyama et al., "Conduction cooling for a crystron; Development of a superconducting magnet; Design and test of oxide superconductor current leads," Proc. for the 52th Meeting of Low Temperature Engineering and Superconductor Physics, p. 235, Autumn 1993.

Primary Examiner—John M. Sollecito
Attorney, Agent, or Firm—Burns, Doane, Swecker & Mathis, LLP

[57] ABSTRACT

A power lead for electrically connecting a superconducting coil with a power supply, comprising thermoelectric cooling means, said means including at least an N-type thermoelectric member and a P-type thermoelectric member, being electrically connected to a positive side and a negative side of said power supply, respectively.

18 Claims, 17 Drawing Sheets

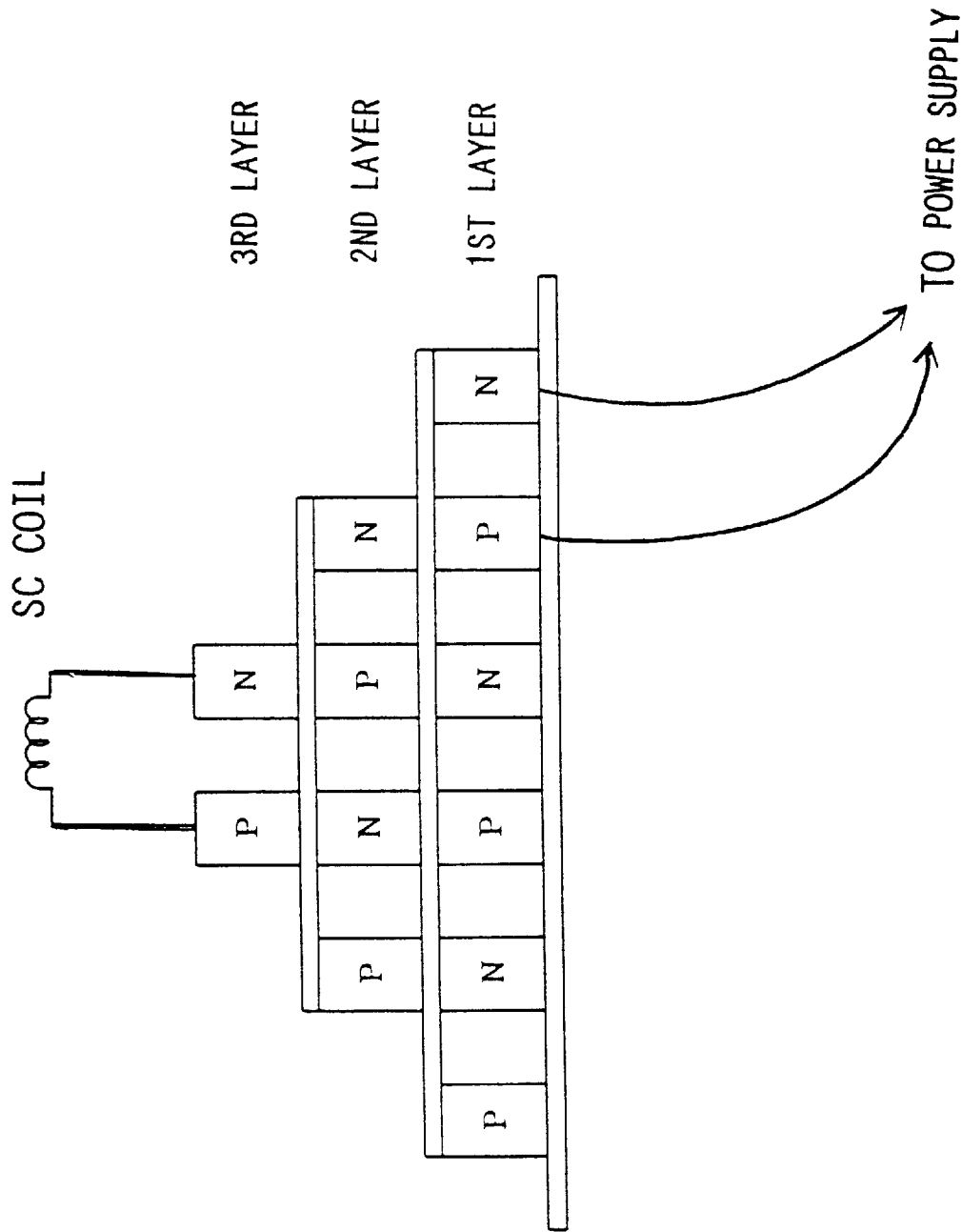

POWER LEAD FOR ELECTRICALLY CONNECTING A SUPERCONDUCTING COIL TO A POWER SUPPLY

FIELD OF THE INVENTION

The present invention relates to a power lead for electrically connecting a superconducting coil to a power supply, and more particularly to a power lead provided with cooling means by the Pertier effect.

BACKGROUND

The structure of a conventional power lead (also referred to as a current lead) used for providing an excitation current to a superconducting coil for magnetization is described below, with reference to FIG. 7 which illustrates schematically the structure of a conventional power lead cooled by a refrigerant gas.

Referring to FIG. 7, a superconducting coil is accommodated in a low temperature region (space) (a very low temperature chamber) such as a liquid helium (4.2° K.) while a power supply is placed in a room temperature environment. A power lead is provided between the superconducting coil and the power supply wherein one end of each power lead is connected to an associated end of the superconducting coil and the other end is connected to an associated electrode of the power supply.

The power lead is made up of a normal conductor such as oxygen free copper (OFCu), having a high electric conductivity. However, since the normal conductor has also high thermal conductivity, heat flows easily into the low temperature from the room temperature environment through the power lead.

Therefore, as shown in FIG. 7, cooling of the power lead by a refrigerant gas such as a helium gas is needed in a superconducting coil device.

A refrigerant gas (helium gas) flowing through the transition region from the low temperature region to the room temperature environment performing such functionalities as (1) reducing an electric resistance of the power lead as a result of which causing a reduction in a joule heat, and (2) exchanging heat flowing in from the room temperature environment to exhaust the heat to an outside.

In order to enhance a heat exchange effectiveness the power lead is usually made to have a structure having a largest possible surface area, such as a mesh or a spiral tubing. FIG. 7 illustrates the structure of a power lead with a mesh (shown as dotted lines).

A heater heats up the liquid helium and forcefully produce helium gas as a refrigerant gas. The liquid helium is supplied through a helium inlet.

Referring to FIG. 16, a conventional power lead cooled by a refrigerant gas is described in detail below. FIG. 16 illustrates a sectional view of a superconducting device comprising a superconducting coil. Since a liquid helium, which is essential to operating the superconducting coil, is expensive, it is preferable to allow the liquid helium to evaporate as little as possible and to prevent heat from coming into a superconducting coil through the current lead (also referred to as a power lead).

Referring to FIG. 16, a superconducting coil 2 is housed inside a cryostat 1, a peripheral wall of which is surrounded by a liquid nitrogen shield 13 made up of double cylinders in order to block any heat (radiation heat) coming in from a radially outside periphery. The liquid nitrogen shield 13, in turn, is accommodated within a vacuum container 15 to form a vacuum heat insulation layer. The liquid nitrogen shield 13 contains a liquid nitrogen 31 and a low temperature nitrogen gas 32 evaporated from the liquid nitrogen 31. The nitrogen gas 32 is emitted into an atmosphere through a nitrogen gas outlet 14 provided on a top of the liquid nitrogen shield 13.

The superconducting coil 2 is connected via a leader line 20 to one end of a lead conductor 3a, a component of current lead 3, while other end of a lead conductor 3a is connected to a terminal 3b located in the room temperature environment. In order to eliminate a joule heat generated in the lead conductor 3a and to prevent a heat from penetrating from a room temperature region into a very low temperature region caused by heat conduction through the lead conductor 3a, a cold helium gas 23 produced by an evaporation of a liquid helium 22 is leaded into a lead tube 3c surrounding the lead 3a to flow the helium gas 23 through a gap 3d between the lead conductor 3a and an inside of the lead tube 3c to cool the lead conductor 3a. After cooling the lead conductor 3a, the helium gas 23, branching from a top of the lead tube 3c, flows into gas tubes 5, and 6, which are connected via an electrically insulating tube joint 4 to be emitted from an external tube 7 which is connected to the gas tube 6. The vacuum container 15 and cryostat 1 are electrically insulated from the lead tube 3c by means of electrical insulator 8.

Referring to FIG. 8, a power lead made up of a high temperature superconducting material is described in the below.

The power lead, shown in FIG. 8, comprises a high temperature superconducting member made up of such as a Bi series 2223 sintered material or YCBO etc. The low temperature region is cooled with a liquid helium (4.2° K.), while a transition region (between the low temperature and room temperature regions) in which the high temperature superconducting member is accommodated, is cooled with both the liquid helium and a liquid nitrogen.

The transition region is separated from the room temperature region by a thermal anchor to be held at a temperature at which the high temperature superconducting member is set to a superconducting status. The thermal anchor is made of a material having a high thermal capacity such as Cu.

The high temperature superconducting member of the power lead shown in FIG. 8, when being cooled below 100° K., does not generate a joule heat even when an electric current flows through the power lead to reduce an amount of heat flux penetrating into the low temperature region.

This structure shown in FIG. 8 has a meritorious effect that the entire high temperature superconducting member may be kept cooled below its critical temperature Tc by an electric conduction instead of by employing a refrigerant gas. A current lead (power lead) comprising an oxide high temperature superconducting material, which does not need a gas cooling system, has been proposed to reduce an amount of a heat flux penetrating into a low temperature region. (For example, see Yokoyama, et al; "Conduction Cooling for a Crystron; Development of a Superconducting Magnet; Design and Test of Oxide Superconducting Current Leads", Proceedings for the Fifty-Second Joint Meeting of Low Temperature Engineering and Superconducting Physics, Autumn 1993, page 235.)

DISCUSSION OF THE RELATED ART

However, according to the investigation of the present invention, the conventional power lead in which a refrigerant gas is employed as shown in FIG. 7 has the following drawbacks.

(1) Expensive because of the reason that a large amount of the refrigerant gas is consumed.

(2) Distributions of both an electric resistance and a temperature in the power lead, which determine the heat flux penetrating from the room temperature environment to the low temperature region, are given as functions of an amount of the refrigerant gas. However, a conductance of the refrigerant gas depends upon a temperature distribution of the power lead. Accordingly, it is extremely difficult to determine an optimum flow of the refrigerant gas, as a result of which a liquid helium must be forcibly evaporated with a heater as shown in FIG. 7.

With the conventional current lead shown in FIG. 16, it is difficult to reduce an amount of a heat flux penetration into a low temperature region when the superconducting coil is in a conduction state.

Further with the power lead in which a high temperature superconducting member is employed as shown in FIG. 8, since heat flow from the room temperature environment to the low temperature region cannot be completely shut off, come cooling system is needed.

A power lead comprising an oxide high temperature superconducting member has been developed (for example, see Industrial Materials; Vol. 41, No. 3, Page 33). In this case, since a temperature at an upper portion of the oxide high temperature superconducting member is fixed at 77° K. (liquid nitrogen temperature), its critical current is small, and the cross section of the high temperature superconducting member must accordingly be made larger. This makes it difficult to reduce an amount of a heat flux penetrating into the low temperature region due to a heat conduction through the high temperature superconducting member.

SUMMARY OF THE DISCLOSURE

Accordingly it is an object of the present invention, to provide a novel power lead which efficiently radiates a heat, and cools by itself to unnecessitate an extra cooling means.

Another object of the present invention is to provide a novel power lead which reduces an amount of heat flow from a room temperature environment to a low temperature region to reduce the consumption of a liquid helium to accomplish highly economical operation of a superconducting coil system.

Still further objects of the present invention will become apparent from the entire disclosure.

Considering the above mentioned objects, there is provided a power lead comprising thermoelectric cooling means, said means including at least an N-type thermoelectric member and a P-type thermoelectric member, being electrically connected to a positive side and a negative side of said power supply, respectively.

The present invention also provides a power lead, comprising:
a thermoelectric cooling means, said means including at least an N-type thermoelectric member and a P-type thermoelectric member, being electrically connected to a positive side and a negative side of said power supply respectively; and
a high temperature superconducting member being located between said thermoelectric cooling means and said superconducting coil.

The invention also provides the power lead as defined in claim 1 or 2, wherein a plurality of said thermoelectric cooling means, each of said thermoelectric cooling means comprising an N-type thermoelectric member and a P-type thermoelectric member, are connected in series.

The present invention also provides a power lead, comprising:

a first and second thermoelectric cooling means, each of said means including a pair of an N-type thermoelectric member and a P-type thermoelectric member;
a first switch provided between one terminal of said AC power supply and said first thermoelectric cooling means; and
a second switch provided between an other terminal of said AC power supply and said second thermoelectric cooling means;
said superconducting coil being accommodated on a side facing one ends of said first and second thermoelectric cooling means, said side being in an opposite direction against a side facing said AC power supply;
wherein said first and second switches are changed in response to a power line frequency so that said N-type thermoelectric members and said P-type thermoelectric members of said first and second thermoelectric cooling means are arranged in an upper stream and a down stream respectively to drive said superconducting coil in an alternating current mode.

Still further, the present invention provides in an another aspect, a power lead for providing an electric current from an external power supply to a superconducting coil immersed in a liquid helium contained in a vacuum cryostat, comprising metal conductors cooled with a liquid nitrogen, and an N-type thermoelectric member and a P-type thermoelectric member, each of said members being connected to said metal conductors, respectively, placed in this order from a room temperature side.

Also the present invention in another aspect provides a power lead comprising:
a metal conductor;
and a high-temperature superconducting member provided in this order from a room temperature side;
a heat conducting member provided close to ends of said metal conductors on a side facing to said superconducting coil and;
a thermoelectric cooling means for cooling said metal conductors, said high temperature superconducting member, and said superconducting coil through said heat conducting member.

According to the present invention, a thermoelectric conversion member (Peltier device) included in a power lead is connected to a power supply to cool down the power lead by means of the Pertier effect. Therefore, a cooling system of the power lead by a refrigerant gas is not needed.

The present invention, having a structure of a plurality of Peltier devices arranged in series substantially improves the cooling efficiency.

With a power lead according to the present invention, which is made up of a Pertier device and a high temperature superconducting member, the Pertier device cools down the high temperature superconducting member below or equal to its critical temperature (Tc), as a result of which cooling of the high temperature superconducting member by a liquid nitrogen is not needed. When additional cooling is required for the high temperature superconducting member, a helium gas rather than the liquid nitrogen may be used to cool a lower temperature side of the high temperature superconducting member.

According to the present invention, as with the conventional power lead using a high temperature superconducting member, only a heat radiating portion is exposed to a room temperature atmosphere when a liquid helium or a liquid nitrogen is not employed for cooling and other portion is housed in a vacuum except. This improves a property of thermal insulation.

According to the present invention, lower temperature sides of the N-type and P-type thermoelectric members of the thermoelectric cooling means are connected to an electrical insulator with a high thermal conductivity, as a result of which an amount of heat absorption is regulated to produce a uniform temperature distribution in the low temperature side.

Further, according to the present invention (See claim 17), the current lead for providing an excitation current from an external power supply to a superconducting coil immersed in a liquid helium comprises metal conductors and an N-type and P-type thermoelectric members connected to the metal conductor in this order from a room temperature side. The metal conductors preferably are cooled with liquid nitrogen (77° K.), as a result of which the metal conductors are cooled by the liquid nitrogen and an amount of heat flowing from the metal conductors is reduced by the thermoelectric cooling device to reduce an amount of heat flux penetrating into a low temperature region.

The present invention as defined in claim 18 applies the invention defined in claim 17 to a power lead in which an electrically conducting member accommodated on a side of a very low temperature side is made up of a high temperature superconducting member. With the invention as defined in claim 18, the high temperature superconducting member is set into a superconducting state at a temperature of about 100° K. at which an electronic resistance becomes zero, as a result of which no joule heat is generated by the high temperature superconducting member. Further a thermal conductivity of a high temperature superconducting member is less than 1/100 of that of copper, so that an amount of heat flux penetrating into a very low temperature regions is reduced. Since the conductor accommodated on a side of a room temperature region is cooled with a liquid nitrogen, a critical current of the high temperature superconducting member is set to that of about 77° K. The present invention cools a high temperature superconducting member by providing a thermoelectric cooling device on a high temperature side to keep the high temperature superconducting member at lower temperature to allow the critical current become larger and the cross section smaller, as a result of which an amount of heat flux flowing into low temperature region may be reduced.

When an electric current is not conducted to the power lead including an N-type and a P-type thermoelectric member, a temperature of the power lead rises to make it difficult to maintain a stable temperature distribution required for an electric conduction. The invention as defined in claim 19, is proposed to resolve this problem. The current leads comprise, metal conductors and high temperature superconducting member provided in this order from a room temperature side and a heat conducting member is provided close to a lower end to the metal conductors, to cool the metal conductors, high temperature superconducting members and a superconducting coil via the heat conducting member of the thermoelectric cooling device.

According to the present invention, the power lead are kept at a low temperature even when a current is not conducted to the power lead to allow a superconducting coil system always ready to operate. Further, an optimum temperature distribution may be obtained by adjusting a current fed to the thermoelectric cooling device.

In the following the meritorious effects of the present invention will be summarized.

According to the present invention, a liquid nitrogen or a helium gas may be supplementally used to cool a high temperature superconducting member in the power leads.

Owing to the cooling effect performed by the thermoelectric cooling device an amount of a liquid nitrogen or a helium gas consumed is significantly reduced as compared to the conventional power lead to contribute to a substantial reduction in operating costs.

According to the present invention, when additional cooling is required for the high temperature superconducting member a Ohelium gas rather than a liquid nitrogen may be used to cool the lower temperature side of the high temperature superconducting member to improve the cooling efficiency.

According to the present invention, switches provided between an AC power supply and the power lead including thermoelectric cooling devices allow for thermoelectric cooling at the same time as an AC operation of the superconducting coil.

Further, according to the present invention, another power supply is used for the thermoelectric cooling device in addition to the power supply for the superconducting coil to make current passing through the superconducting coil and the thermoelectric cooling devices to be monitored and controlled separately to obtain an optimum cooling efficiency.

According to the present invention, the lower temperature sides of the N-type and P-type thermoelectric materials of the thermoelectric cooling device are connected by an electrical insulator with high thermal conductivity. This configuration eliminates the occurrence in the difference in temperature difference between the N-type and P-type thermoelectric materials on the low temperature sides which is caused by their asymmetric thermoelectric characteristics.

Further, according to the present invention, the current lead to provide an electric current from the external power supply to the superconducting coil immersed in liquid helium include metal conductors, N-type and P-type thermoelectric members connected to the metal conductors, in this order from a room temperature side, and the metal conductors are cooled by a liquid nitrogen. Thus, the metal conductors are cooled by the liquid nitrogen and an amount of heat penetrating from the metal conductor is reduced by the thermoelectric device. This structure substantially reduces an amount of the heat flux penetrating into the very low temperature environment. By inserting an electric conductor made up of a high temperature superconducting material between the superconducting coil and the N-type and/or P-type thermoelectric member, the high temperature superconducting member is cooled through metal conductors by a liquid nitrogen and also by the thermoelectric cooling device to keep the high temperature superconducting member at a lower temperature, as a result of which, the value of critical current may become larger, the size of required cross section of the power lead may be reduced and an amount of heat flux penetrating into a low temperature region may be significantly reduced. Thus, the present invention can significantly reduce an amount of expensive liquid helium consumed for cooling the power lead.

According to the present invention, the power lead include metal conductors and a high temperature superconducting member, wherein lower parts of the metal conductors are cooled via a heat conducting member by the thermoelectric cooling device to keep the high temperature superconducting members to be in a superconducting state and to maintain the power lead at a low temperature even when the superconducting coil is not excited. Further, by controlling the current from another power supply through the thermoelectric cooling device, an optimum temperature distribution in the power lead may be obtained.

BRIEF DESCRIPTION OF THE DRAWINGS

FIG. 17 shows schematically an electric connection between a superconducting coil, a power lead, and a power supply for driving the superconducting coil, in which the power lead comprises of thermoelectric cooling devices configured in a piramid shaped multiple stage connection as shown in FIG. 10.

PREFERRED EMBODIMENT

Detailed descriptions of the preferred embodiments of the present invention are described below with reference to the accompanying drawings.

Embodiment 1

Figure 1:
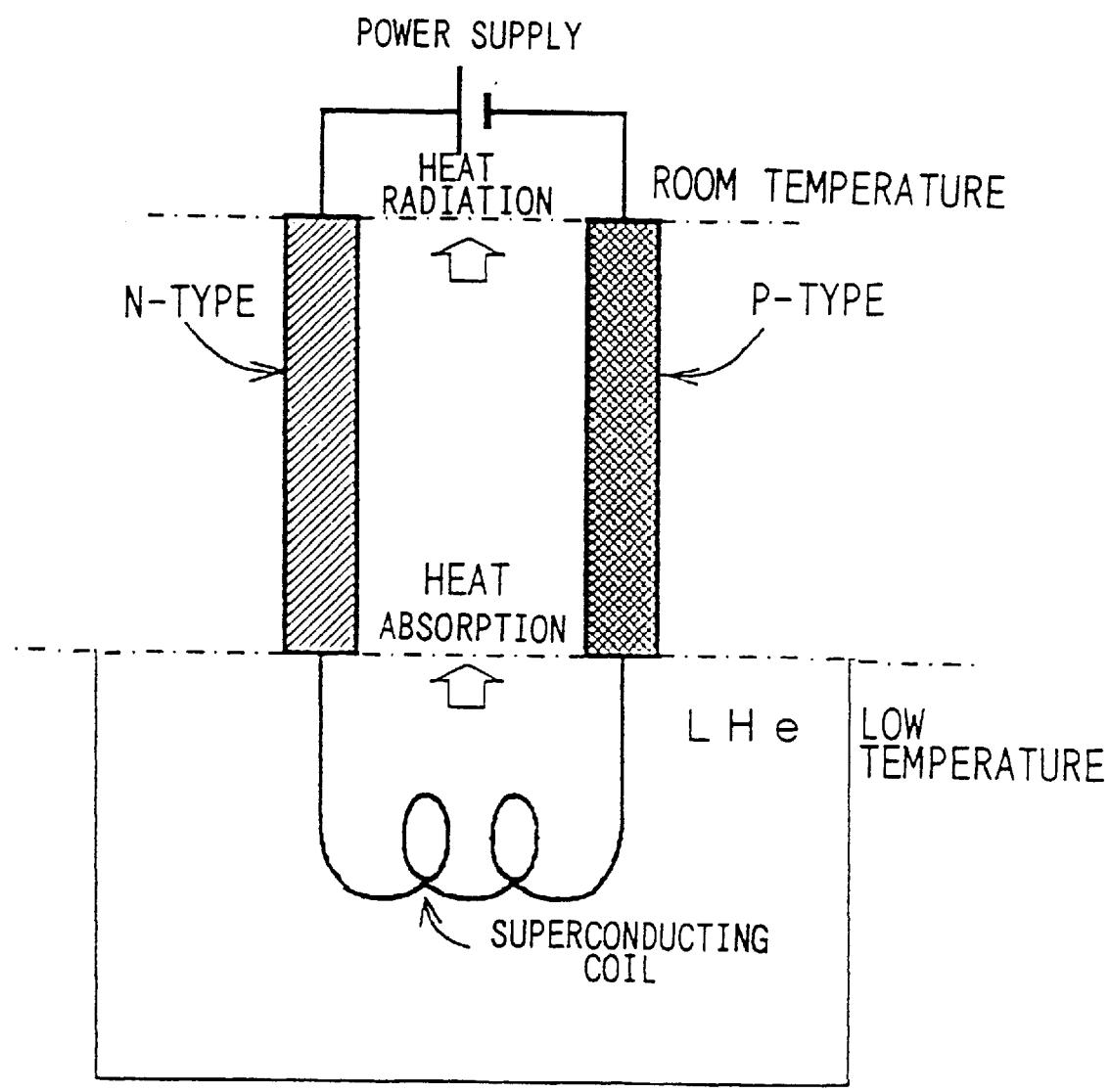
FIG. 1 shows the structure of the first embodiment of the present invention.

Referring to FIG. 1, a power lead electrically connects a superconducting coil immersed in a liquid helium with a power supply placed in a room temperature environment. The power lead comprises an N-type thermoelectric member connected to a positive side of the power supply and a P-type thermoelectric member connected to the negative side thereof.

When the P-type and N-type thermoelectric members are connected to a $\pi$ shape and a DC electric current is provided from the N-electrode to the P-electrode, heat is absorbed at a junction of the P-type and N-type thermoelectric members and heat is radiated at the other ends, which are connected to associated electrodes of a power supply respectively, by means of the Pertier effect. A thermoelectric cooling is executed by the Pertier effect.

More specifically, the heat absorption occurs at the lower temperature side according to the following formula.

$$q_n - q_p = (\pi_n - \pi_p)J \qquad (1)$$

where J is an electric current density, $\pi_N$ and $\pi_P$ are absolute Peltier coefficients of the N-type and P-type thermoelectric materials, respectively, and, $q_N$ and $q_P$ are amounts of the heat that electrons carry in the N-type and P-type thermoelectric members, respectively.

Referring to FIG. 1, since the power lead comprises a thermoelectric cooling device made up of the N-type and P-type thermoelectric members, heat is removed from a low temperature side when an electric current is conducted. Therefore, heat does not flow from the room temperature environment into the low temperature region to unnecessitate a conventional cooling system of the power lead.

Thermoelectric members which exhibit large figures of merit at a liquid nitrogen temperature include an N-type Bi-Sb alloy and a P-type Bi series 2223 (sintered body), (See, for example, Nakano, el al: "Peltier Refrigeration (Thermoelectric Refrigeration) using High Temperature Superconductors", Proceedings for the Fiftieth Joint Meeting of Low Temperature Engineering and Superconductor Physics, Autumn 1994, page 270.)

Note also that in the present embodiment the N-type and P-type thermoelectric cooling devices may also be cooled with a helium gas produced by an evaporation of the liquid helium as a supplementary cooling mechanism. In this case consumption of the helium gas is much reduced.

Embodiment 2

Figure 2:
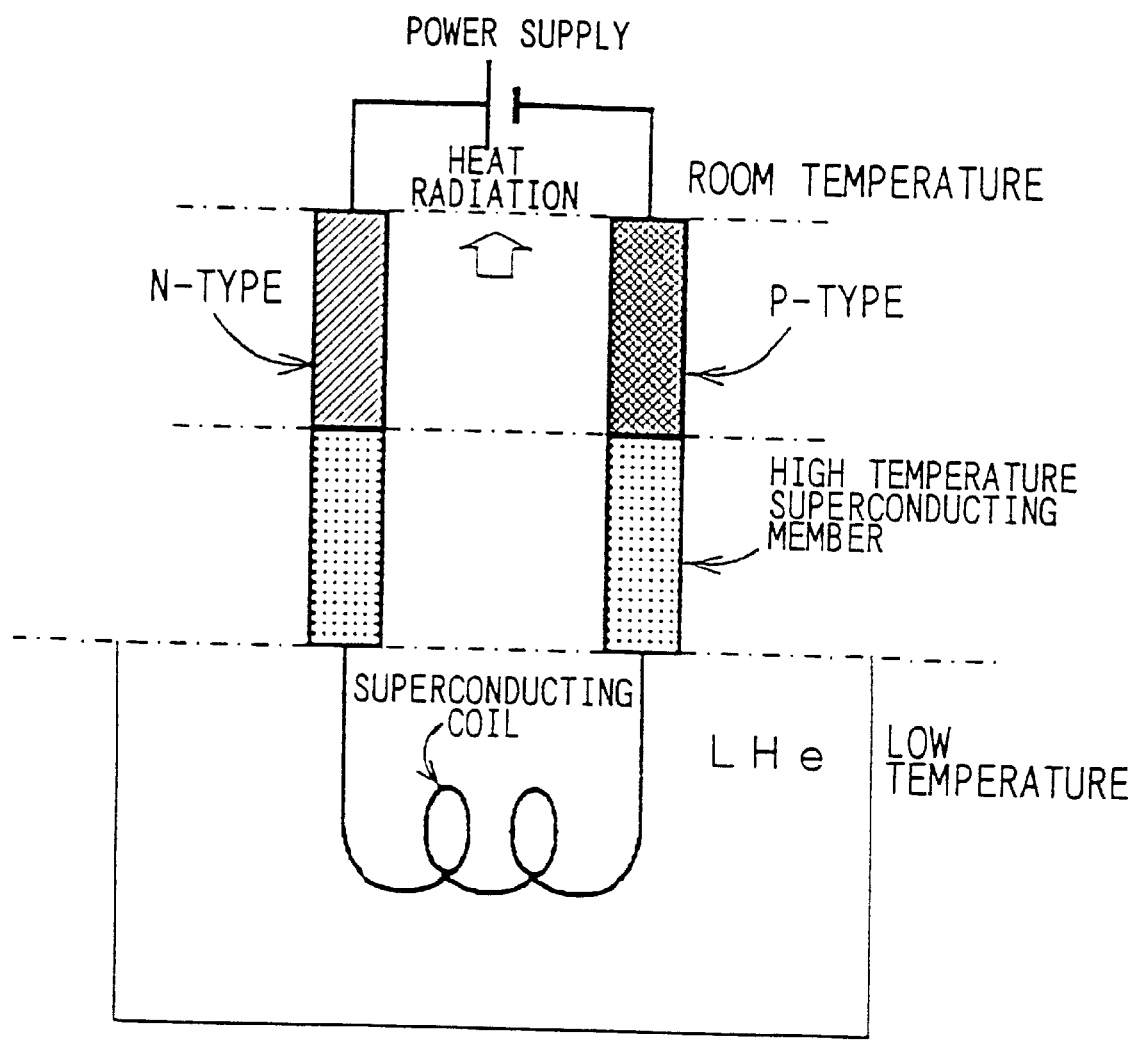
FIG. 2 shows the structure of the second embodiment of the present invention.

FIG. 2 illustrates the configuration of the second embodiment of the present invention. Referring to FIG. 2, the power lead of the present invention comprise an N-type thermoelectric member connected to a positive side of the power supply and a P-type thermoelectric material connected to a negative side thereof, each thermoelectric member being connected to the high temperature superconducting member which in turn is connected to a superconducting coil.

The N-type and P-type thermoelectric members forming a thermoelectric cooling device are cooled down substantially from a room temperature (about 300° K.), wherein heat absorption takes place at a region where the high temperature superconducting members are attached. Preferably this cooling mechanism is enough to keep the temperature of this region below a critical temperature Tc of the high temperature superconducting member. However, in case that this mechanism is not sufficient for cooling, a liquid nitrogen may also be used. Even in the case that the liquid nitrogen is used, the thermoelectric members (the thermoelectric cooling device) significantly enhance the cooling efficiency.

In the present embodiment the high temperature superconducting member may also be cooled with a helium gas produced by an evaporation of a liquid helium.

Since the power lead in the present embodiment include the high temperature superconducting members, there is no heat generation when operated at a temperature below Tc, as a result of which an amount of heat flux flowing into the low temperature regions is significantly reduced. Since the power lead also include the thermoelectric cooling device, the temperature of the high temperature superconducting members may easily and efficiently by maintained below a critical temperature Tc without adopting an additional cooling mechanism.

In the present embodiment, even if a liquid nitrogen or helium gas is used for cooling, the thermoelectric cooling device significantly reduces an amount of the liquid nitrogen or helium gas consumed as compared to that of the aforementioned conventional power lead.

Embodiment 3

Figure 3:
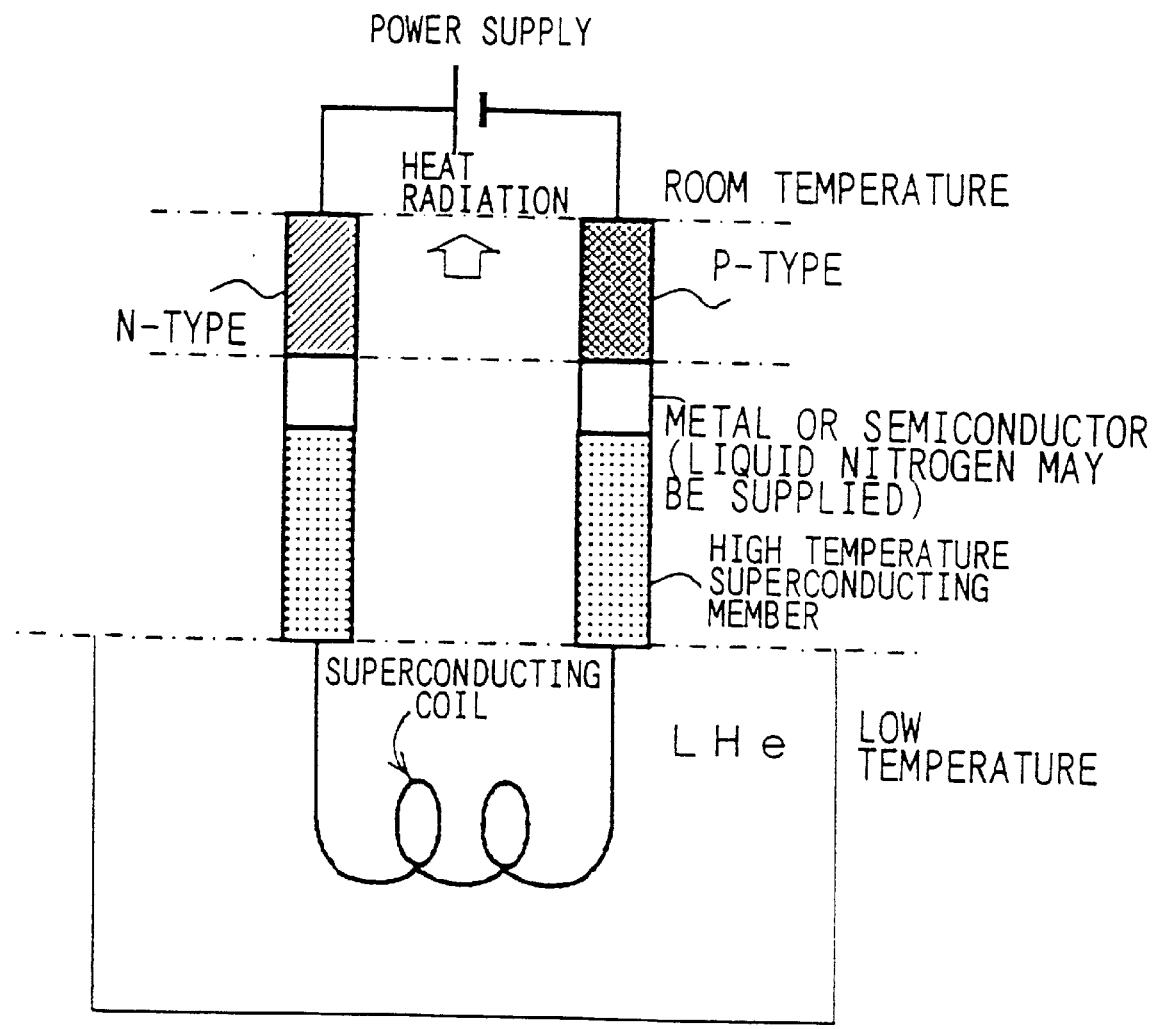
FIG. 3 shows the structure of the third embodiment of the present invention.

FIG. 3 illustrates the configuration of the third embodiment of the present invention. Refering to FIG. 3 the power lead of the present embodiment comprises, N-type and P-type thermoelectric members, a metal (or a semiconductor), and a high temperature superconductor.

In the present embodiment the metal (or the semiconductor) may be cooled with a liquid nitrogen. In this case a bath to contain the liquid nitrogen (not shown) is provided to cool the metal (or the semiconductor).

The present embodiment is used preferably in case that a thermoelectric cooling device made up of N-type and P-type thermoelectric members is not sufficient to keep temperature of the high temperature superconducting member below its critical temperature Tc.

Embodiment 4

Figure 4:
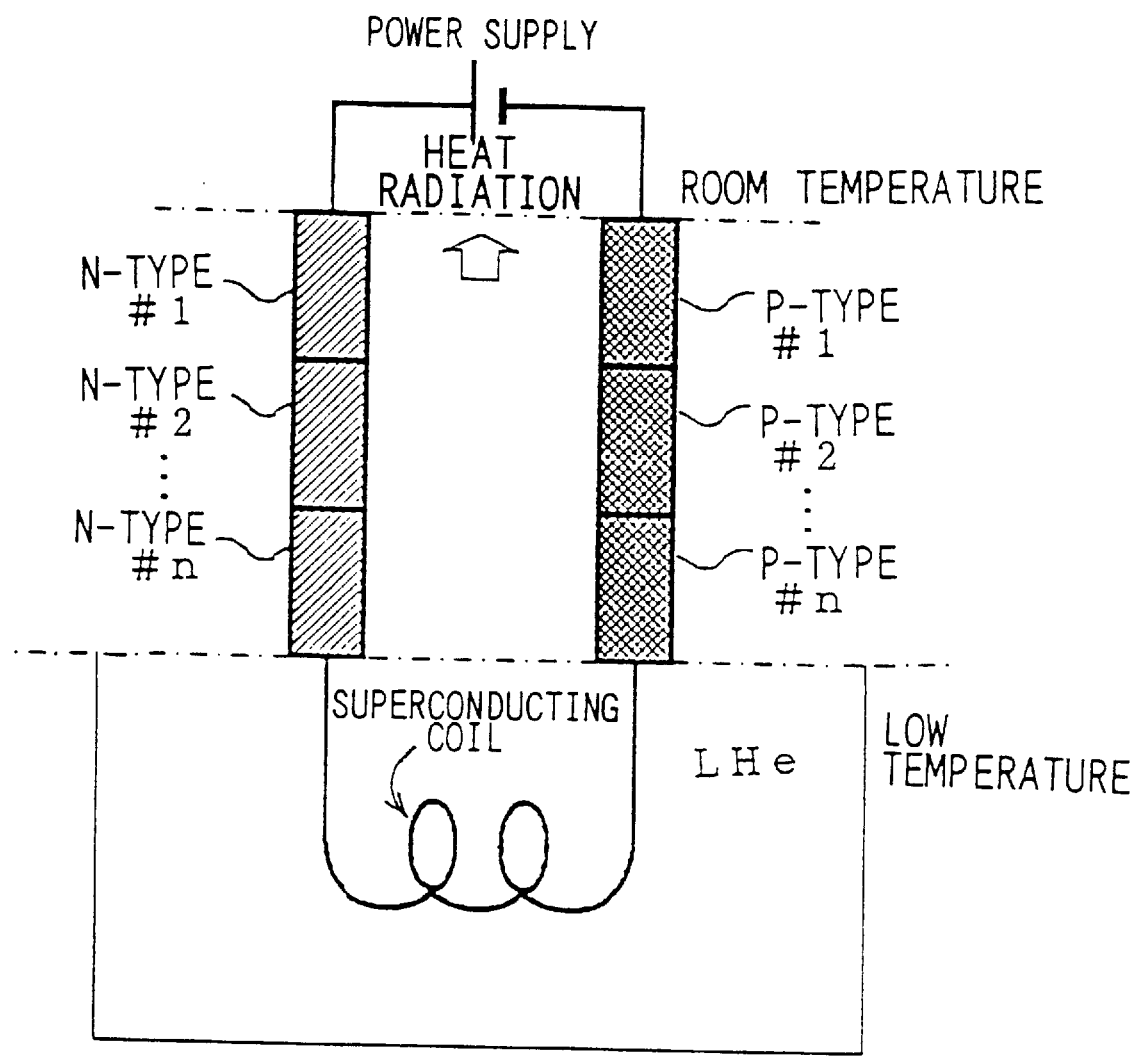
FIG. 4 shows the structure of the fourth embodiment of the present invention.

FIG. 4 shows the configuration of the fourth embodiment of the present invention. Refering to FIG. 4 the power lead of the present embodiment comprises a plurality of thermoelectric cooling devices arranged in a cascade connection, with each thermoselectric cooling device including N-type and P-type thermoelectric members. As shown in FIG. 4 different thermoelectric cooling devices are placed in the regions with different temperatures. Each of the thermoelectric cooling devices absorbs heat at a lower temperature region and radiates heat at a higher temperature region.

The difference between the highest and lowest temperatures created by a plurality (=n) of the thermoelectric cooling devices connected in series in the present embodiment is approximately equal to the sum of the temperature differences that the individual thermoelectric cooling device creates $\Delta T_i$ (i=1~n). Thus, an additional cooling mechanism for the power lead may not be needed.

Figure 9:
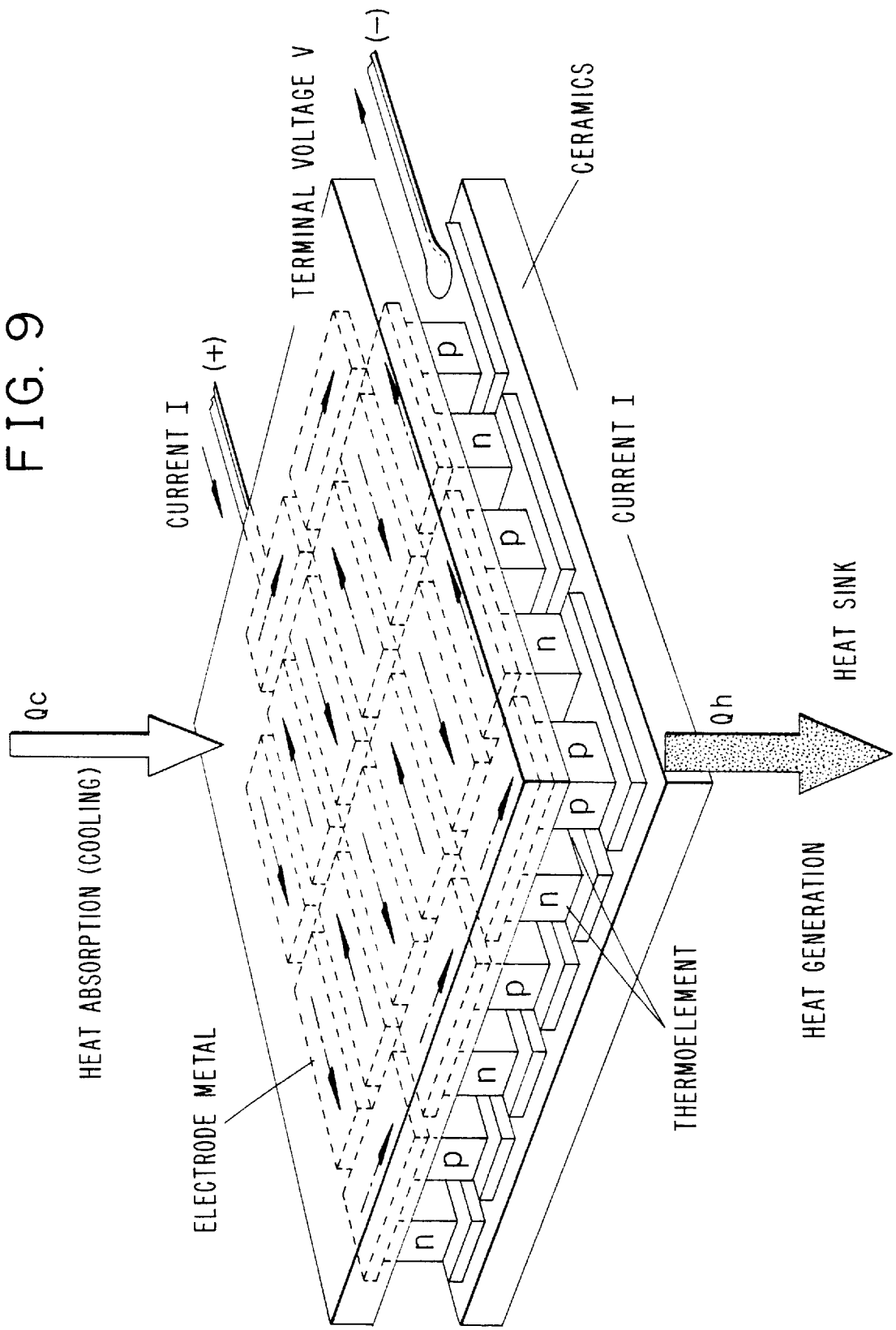
FIG. 9 show a module of thermoelectric cooling devices connected to each other in series.

A modified arrangement of the thermoelectric cooling devices of the present invention is shown in FIG. 9, in which a few to more than ten thermoelectric cooling devices made up of N-type and P-type thermoelectric members are connected in series and sandwiched between two ceramic plates. (This configuration is referred to as the one-layer module.)

Thermoelectric cooling devices made upon of the N-type and P-type thermoelectric members are aligned in a two dimensional array wherein each junction portion by a metal electrode of the thermoelectric cooling devices is arranged in the same side in the corresponding array layer as shown in FIG. 9. An electric current flowing through the individual thermoelectric cooling device comes into the N-type thermoelectric member and goes out of the P-type thermoelectric member to absorb heat on a lower temperature side of a corresponding array layer and radiate heat on a higher temperature side of the array layer.

In the present embodiment, in which two thermoelectric cooling modules of FIG. 9 are used, the superconducting coil (not shown) which is immersed in a liquid helium is connected between predetermined thermoelectric cooling devices of a first layer module on a heat absorbing side.

The difference between the highest and lowest temperatures created by a plurality of the thermoelectric cooling devices connected in series is approximately proportional to the number of the thermoelectric cooling devices connected in the series. This configuration enhances a cooling efficiency. Thus, an additional cooling mechanism for the power lead may not be needed.

It is noted that each of the thermoelectric cooling devices connected in the series may be made up of different materials in order to obtain the best figure of merit at each the temperature region.

Figure 10:
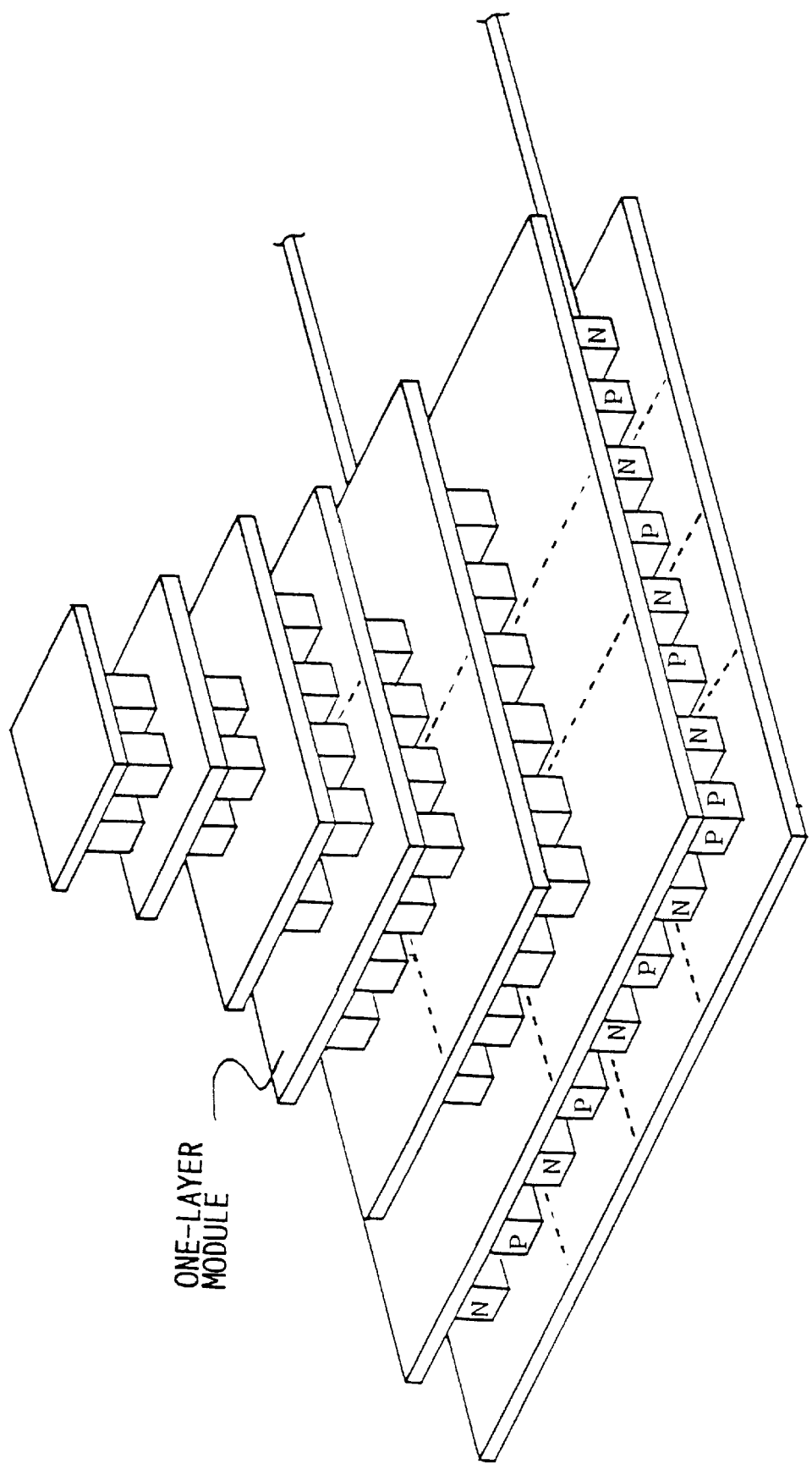
FIG. 10 shows a module of thermoelectric cooling devices configured in layers.

A plurality of one-layer modules, one layer of which is shown in FIG. 9 may be stacked in a pyramid shape as shown in FIG. 10 in which six layers, as an example, are put together in a cascade. (The number of thermoelectric cooling devices is larger at a bottom side and smaller at an upper side.) This configuration allows for an even greater temperature difference.

FIG. 17 illustrates schematically an electric connection between the superconducting coil, the power lead, and the power supply for driving the superconducting coil, in which the power lead comprises of thermoelectric cooling devices configured in a pyramid shaped multiple stage connection as shown in FIG. 10. In FIG. 17, three layered cascade connection of the thermoelectric cooling devices are shown. Referring to FIG. 17, ends of the superconducting coil are connected to the thermoelectric cooling device made up of N-type and P-type thermoelectric members, located at a top (3rd) layer and against a plurality of thermoelectric cooling devices arranged in a first layer in a two-dimensional array, each being made up of N-type and P-type thermoelectric members, power supply terminals are so connected to enable an electric current to come into the N-type thermoelectric member and go out of the P-type thermoelectric member, as a result of which the thermoelectric cooling devices absorb heat at a low temperature side (an upper junction side FIG. 17) and radiates heat at a high temperature side (a lower junction side in FIG. 17).

The difference in temperature between junctions, being located in opposite sides of the thermoelectric device, in the one layer module shown in FIG. 9 cannot exceed the maximum temperature difference (referred to as $\Delta T_{JM}$) for the individual thermoelectric cooling device determined by its constituent N-type and P-type thermoelectric materials. Therefore, in the case that the temperature difference ($\Delta T_J$) for the individual thermoelectric cooling device of the one-layer module is equal to $\Delta T_{JM}$, ($\Delta T_J = \Delta T_{JM}$), the capability of absorbing heat and the efficiency at the low temperature junction are zero. However, in case that the modules are stacked in such a configuration as shown in FIG. 10 and heat radiated from the upper layer is absorbed by the lower layer, the above restriction may be solved.

As explained below, the one-layer thermoelectric cooling module shown in FIG. 9 and the multiple-layered thermoelectric cooling modules as shown in FIG. 10 in the present embodiment may preferably be driven by a power supply separate from the power supply which drives the superconducting coil.

Embodiment 5

Figure 5:
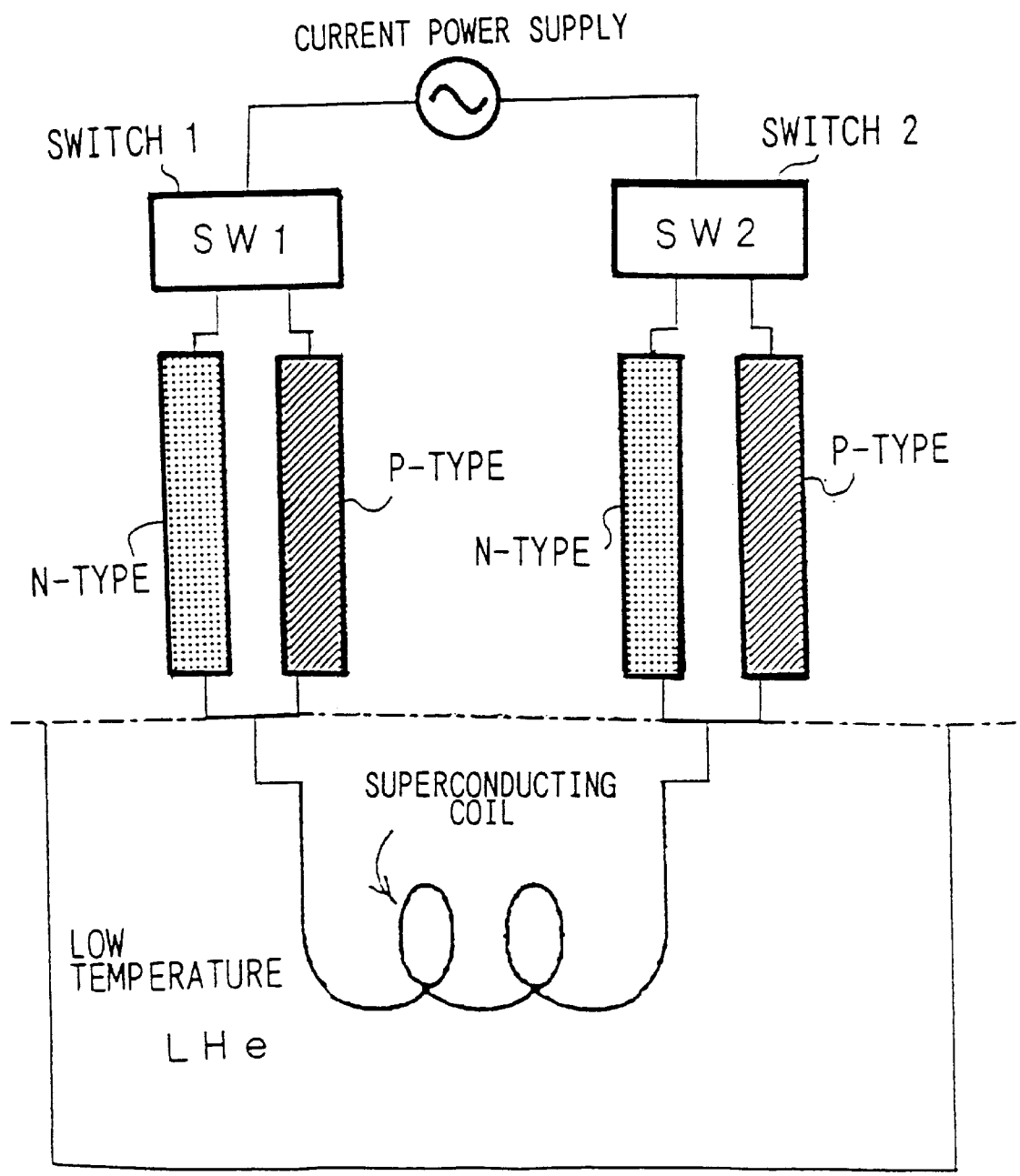
FIG. 5 shows the structure of the fifth embodiment of the present invention.

FIG. 5 shows the configuration of the fifth embodiment of the present invention. Referring to FIG. 5, the present embodiment utilizes an AC power supply to drive a superconducting coil and a power lead comprising two thermoelectric cooling devices each including N-type and P-type thermoelectric members. A first switch SW1 is provided between one end of the power supply and the first thermoelectric cooling device, and a second switch SW2 is provided between the other end of the power supply and the second thermoelectric cooling device.

More specifically, referring to FIG. 5, one ends of the N-type and P-type thermoelectric members of the first thermoelectric cooling device are connected to terminals of the first switch SW1 respectively, and the other end of the N-type and P-type thermoelectric members are connected in common to one terminal of the superconducting coil. Likewise, one end of the N-type and P-type thermoelectric materials of the second thermoelectric cooling device are connected to terminals of the second switch SW2 respectively and the other end of the N-type and P-type thermoelectric members are connected in common to the other terminal of the superconducting coil.

The first and second switches SW1 and SW2 change the polarity of an electric current from the power supply every half period, so that the current always flows into the N-type thermoelectric member of either the first or second thermoelectric cooling device and flows out of the P-type thermoelectric member. (The N-type thermoelectric member is located an upper stream, while the P-type thermoelectric members is located in the lower stream.) Thus, the N-type and P-type thermoelectric members adopted in the present embodiment operate as a thermoelectric cooling device.

Since the polarities at the ends of the superconducting coil are not affected by the operation of the switches SW1 and SW2, it is possible to drive the superconducting coil in an AC (alternating current) mode. It is noted that the power lead of the present embodiment may also include a high temperature superconducting member and that the power lead of the present embodiment may have a configuration of stacked thermoelectric cooling devices.

Embodiment 6

Figure 6:
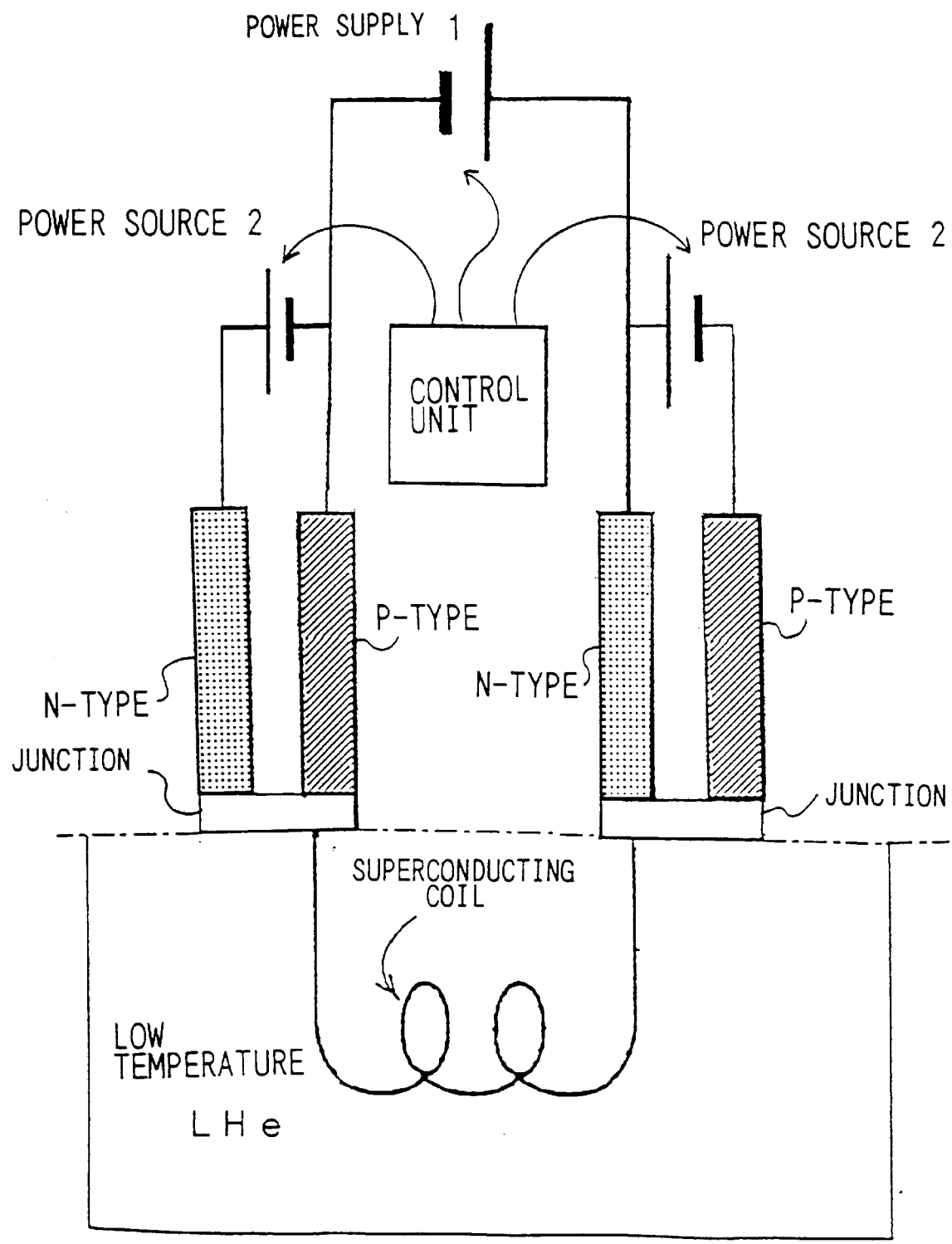
FIG. 6 shows the structure of the sixth embodiment of the present invention.
Figure 7:
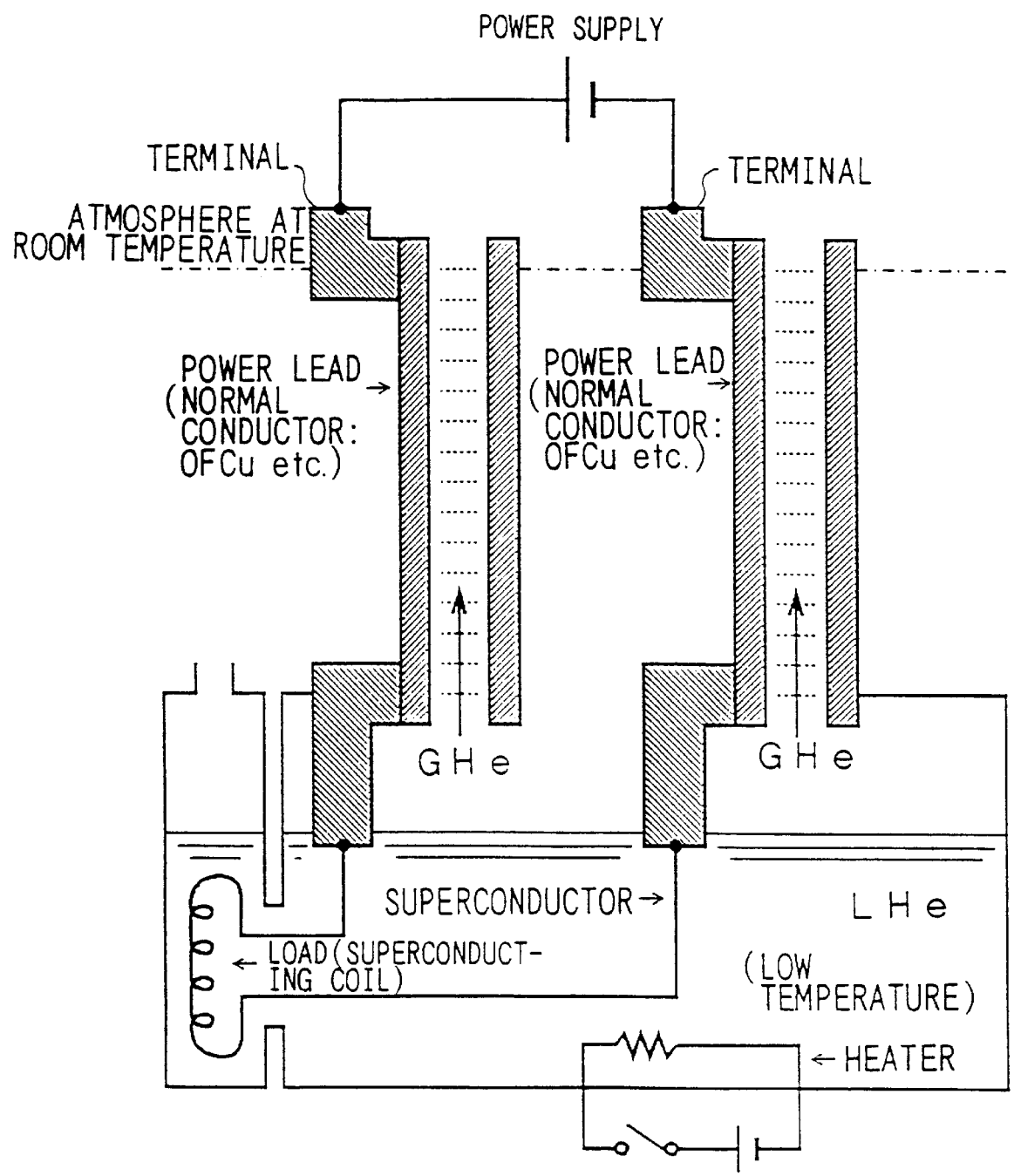
FIG. 7 shows the gas cooled power leads of the prior art.
Figure 8:
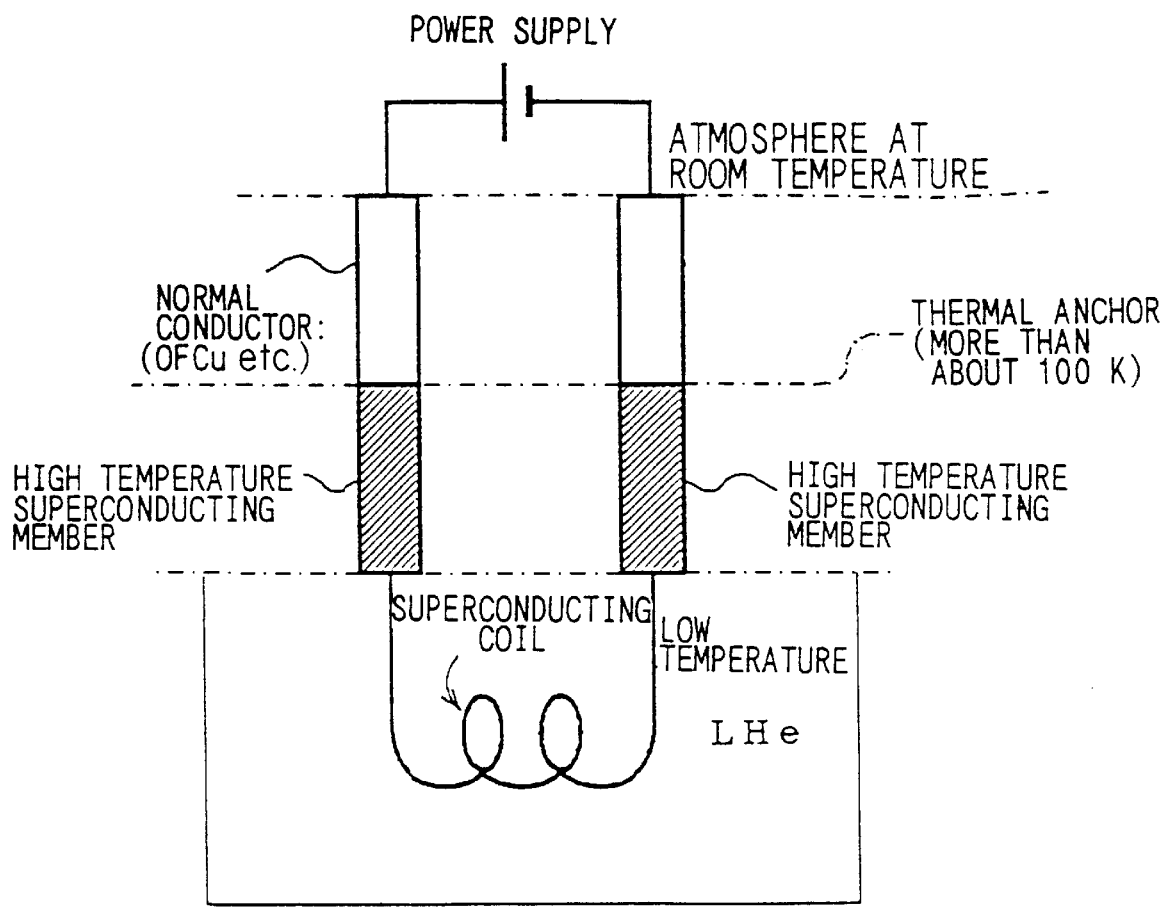
FIG. 8 shows the structure of the conventional power leads employing high temperature superconductors.

FIG. 6 shows the configuration of the sixth embodiment of the present invention. The present embodiment is described below with reference to FIG. 6.

Cooling capability of a thermoelectric cooling device made up of N-type and P-type thermoelectric members depends upon an electric current flowing through the thermoelectric cooling device.

Since, in the embodiments mentioned above, thermoelectric cooling device are connected directly to the power supply to supply an excitation current to the superconducting coil for a magnetization, it is not possible to control the current flowing through the superconducting coil and the degree of the cooling independently.

The present embodiment is developed to resolve this problem. Referring to FIG. 6, a power supply 1 supplies an electric current to the superconducting coil, and another power supplies 2 supply electric currents to the corresponding thermoelectric cooling devices (also referred to as the Peltier devices) respectively. A control unit controls these power supplies so that the thermoelectric cooling devices perform optimum cooling. More specifically, the control unit monitors the currents flowing through the superconducting coil and the thermoelectric cooling devices, and provides control signals to each power supply to change the amount of currents, as a result of which, an optimum cooling is realized.

Embodiment 7

Figure 11:
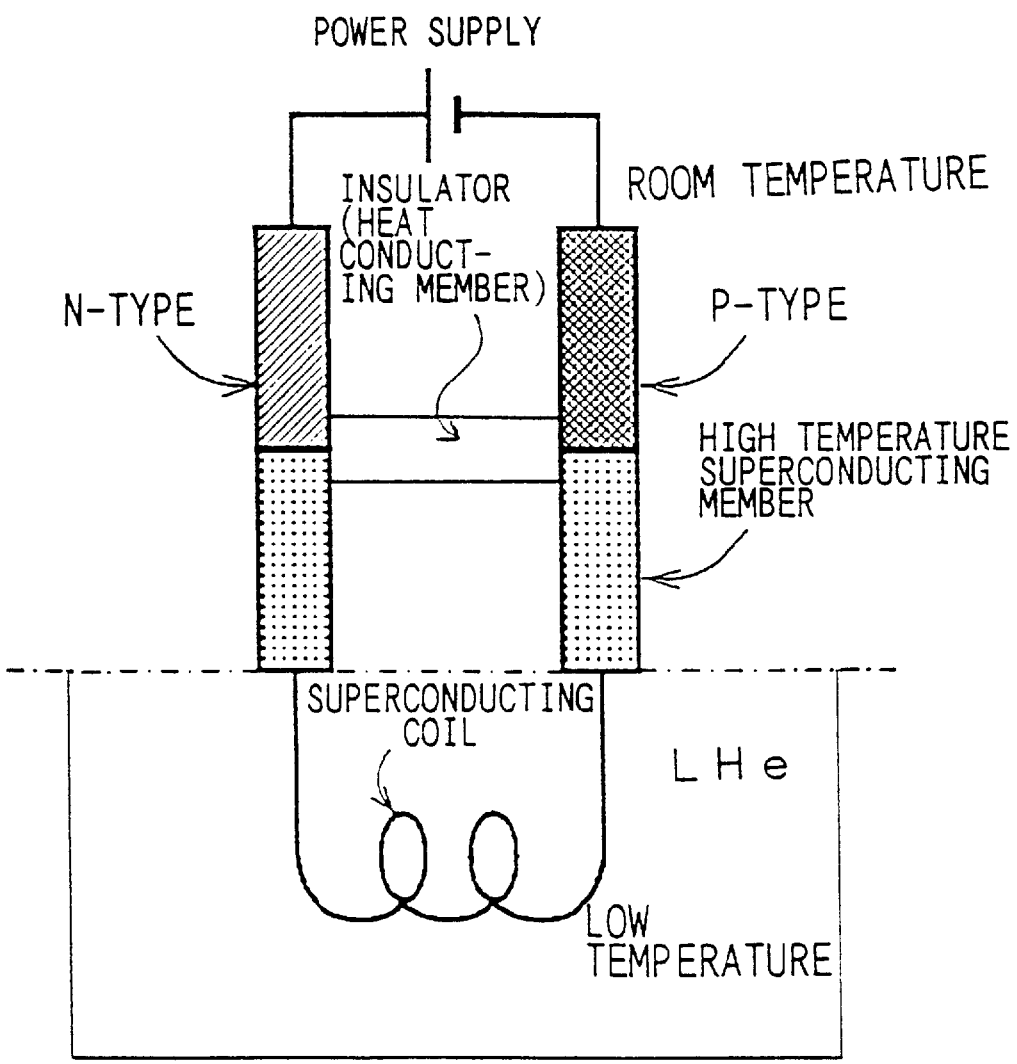
FIG. 11 shows the structure of the seventh embodiment of the present invention.

FIG. 11 shows the configuration of the seventh embodiment of the present invention. The present embodiment is described below with reference to FIG. 11.

It is very unlikely that N-type and P-type thermoelectric materials forming a thermoelectric cooling device have characteristics symmetrical with each other. Therefore, in order to obtain the best figure of merit an optimum design is sought in manufacturing the thermoelectric cooling device, in which the N-type and P-type thermoelectric members may have different cross sections. As a result, the amounts of heat absorbed by the N-type and P-type thermoelectric materials are made different.

A typical Peltier device has a $\pi$ shaped structure in which the N-type and P-type thermoelectric materials are connected by a metal such as copper which has a high thermal conductivity. Thus the difference in heat absorption between the two thermoelectric materials does not cause any significant problem. However, when thermoelectric materials are used in a power lead, they are spatially separated from each other and hence a temperature difference, at a low temperature side, is generated.

The present embodiment resolves this problem. The N-type and P-type thermoelectric members are thermally connected but electrically insulated at a low temperature side. That is to say, as shown in FIG. 11, the N-type and P-type thermoelectric members are connected each other, at the low temperature side, via a good electrical insulator with a large thermal conductivity. Thus, the N-type and P-type thermoelectric members have the same temperature on the low temperature side.

Embodiment 8

Generally a power supply for a large current is expensive. A load with a low impedance, such as a superconducting coil, needs a power supply of a large current capacity, which is not very desirable. Accordingly, Pertier devices, may be connected in series to operate with a power supply which provides a small current with an appropriate voltage.

Since a large electric current (for example, 100Å order) is needed to excite (magnetize) the superconducting electric coil, the power supply must provide the large current and thus is expensive. In order to prevent heat from coming from a low temperature region when the superconducting coil is not energized, a second power supply may be provided to drive the Pertier devices as explained in the above mentioned Embodiment 6 (see FIG. 6). This power supply, however, must provide a large current and hence is expensive.

Figure 12:
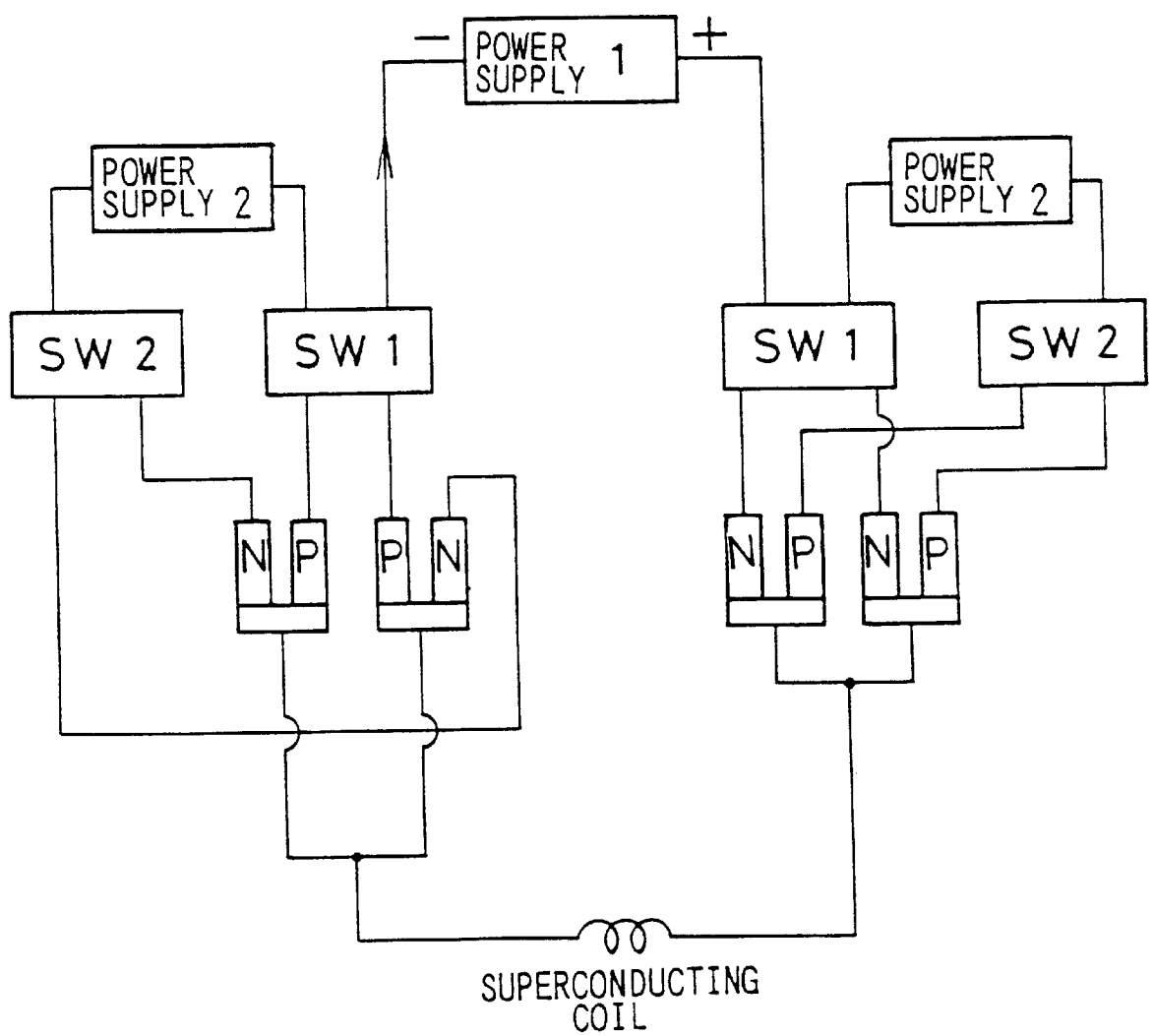
FIG. 12 shows the structure of the eighth embodiment of the present invention.

Therefore, in the present embodiment, as shown in FIG. 12, a plurality of N-type and P-type thermoelectric members are connected in parallel when the superconducting coil is excited by a power supply 1. An electric current supplied from power supply 1 goes into the N-type thermoelectric materials connected in parallel through SW1, flows through the superconducting coil, comes out of the P-type thermoelectric materials connected in parallel, and returns to the power supply 1 through SW1. When the superconducting coil is not excited the plurality of thermoelectric devices are connected in series by means of switches SW1 and SW2 in order to reduce the current of power supply 2.

Embodiment 9

The ninth embodiment of the present invention is described with reference to FIG. 13. The above mentioned embodiment 3 (see FIG. 3) of the present invention includes the conductors which are placed between the high temperature superconductors and the N-type and P-type thermoelectric materials (semiconductors). In the present embodiment the two conductors made up of such as Cu etc., are connected via a switch as shown in FIG. 13.

When the superconducting coil (also referred to as the superconducting magnet) is not excited and when it is being cooled down, the switch SW is closed to connect the two conductors electrically. An electric current from the power supply flows through the N-type thermoelectric member, the conductor, the switch, the other conductor, and the P-type thermoelectric member. This configuration, therefore, prevents heat from penetrating into the low temperature region, even when the superconducting coil is not generating a magnetic field. When the superconducting coil is excited, the switch is left open so that the current from the power supply flows through a closed loop made up of the N-type thermoelectric member, the conductor, the high temperature superconducting member, the superconducting coil, the other high temperature superconducting member, the other conductor, and the p-type thermoelectric member.

Figure 13:
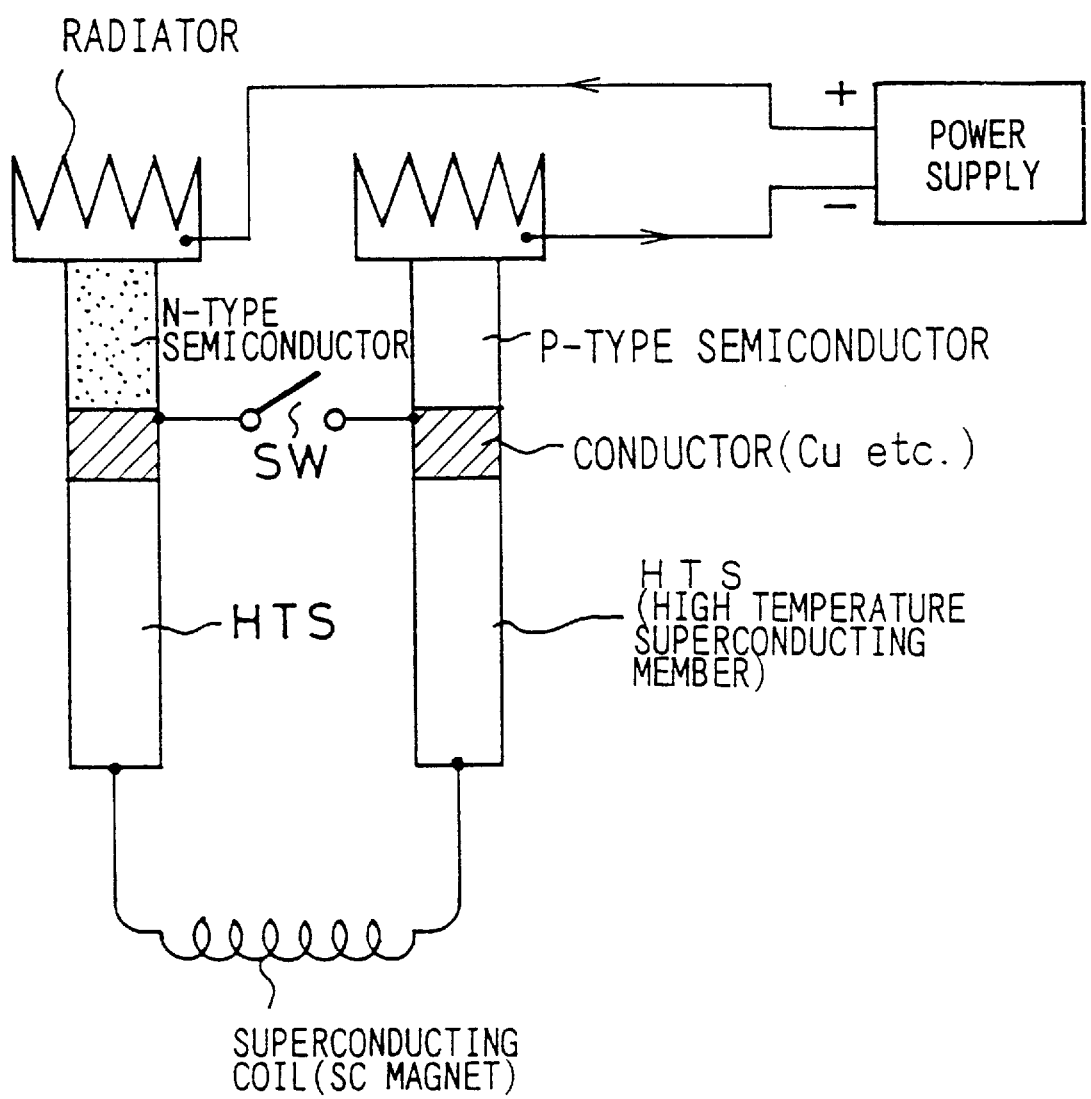
FIG. 13 shows the structure of the ninth embodiment of the present invention.

In the present embodiment, as shown in FIG. 13, radiators are attached to the N-type and P-type thermoelectric member made up of semiconductor materials to improve the radiation efficiency.

Embodiment 10

Figure 16:
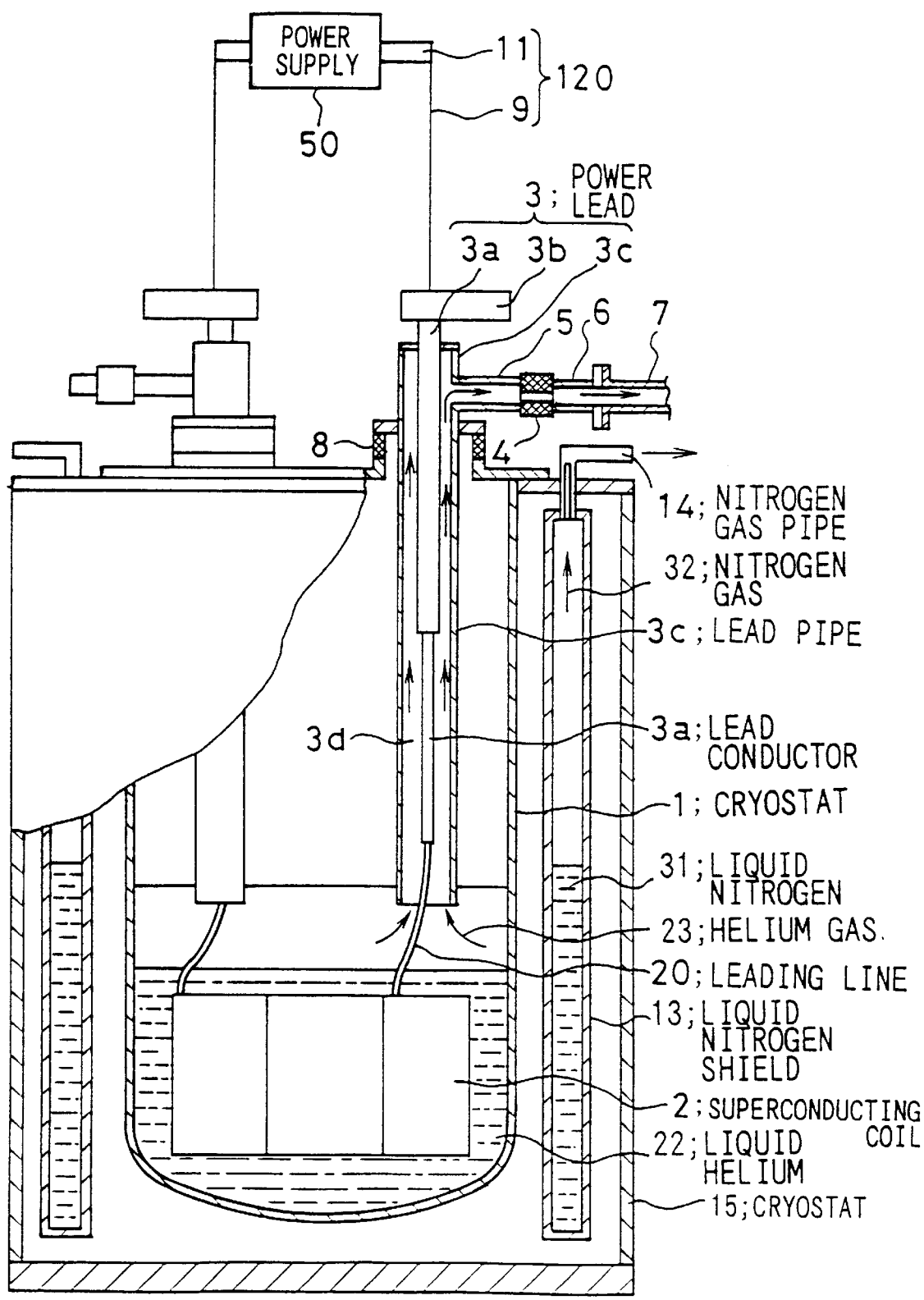
FIG. 16 shows a cross section of a superconducting device using conventional power leads.

The tenth embodiment of the present invention is described below with reference to FIG. 14. In this figure the same components or the components having the same functions as those of the conventional superconducting device shown in FIG. 16 are denoted by the same reference numbers. The difference between the present embodiment and the conventional device is described below.

The major difference between the present embodiment and the conventional power lead using a high temperature superconducting member (see for example, Industrial Materials, Vol. 41, No. 3, Page 33) is that an N-type thermoelectric member 200 is inserted between a copper conductor 300 and a high temperature superconductor (HTS, which is preferably made up of an oxide superconductor material) 301 on side of a positive electrode of a DC power supply 50, while a P-type thermoelectric member 201 is inserted between a copper conductor 300 and a high temperature superconducting member 301 on a side of a negative electrode of the DC power supply 50.

A superconducting coil 2 is placed in a vacuum insulated cryostat 1 and is cooled to a vary low temperature with a liquid helium 22. The superconducting coil 2 is connected through connecting wires 21 to the power lead (a positive polarity is made up of 301, 200, and 300; and an negative polarity is made up of 301, 201, and 300). One ends of copper conductors 300 at a room temperature side are connected to one ends of cables 9, other ends of which are connected to a plus and minus terminals of the power supply 50 respectively. The power supply 50 provides a current required to magnetize the superconducting coil 2.

The room temperature sides of the power lead, that is, the copper conductors 300 are supported by a cover 101. Copper conductors 300 are cooled with a liquid nitrogen 31. The nitrogen gas 32 produced by an evaporation of the liquid nitrogen 31 is released through a pipe arranged in the cover 101.

Cooling copper conductors 300 with the liquid nitrogen 31 keeps a bottom part of the copper conductors around 77° K. Further, the N-type thermoelectric member 200 inserted between copper conductor 300 and the high temperature superconducting member 301 on a side of a positive polarity and the p-type thermoelectric member 201 similarly placed on a side of a negative polarity of the power lead cool down the high temperature superconducting member 301 to below 77° K.

Figure 14:
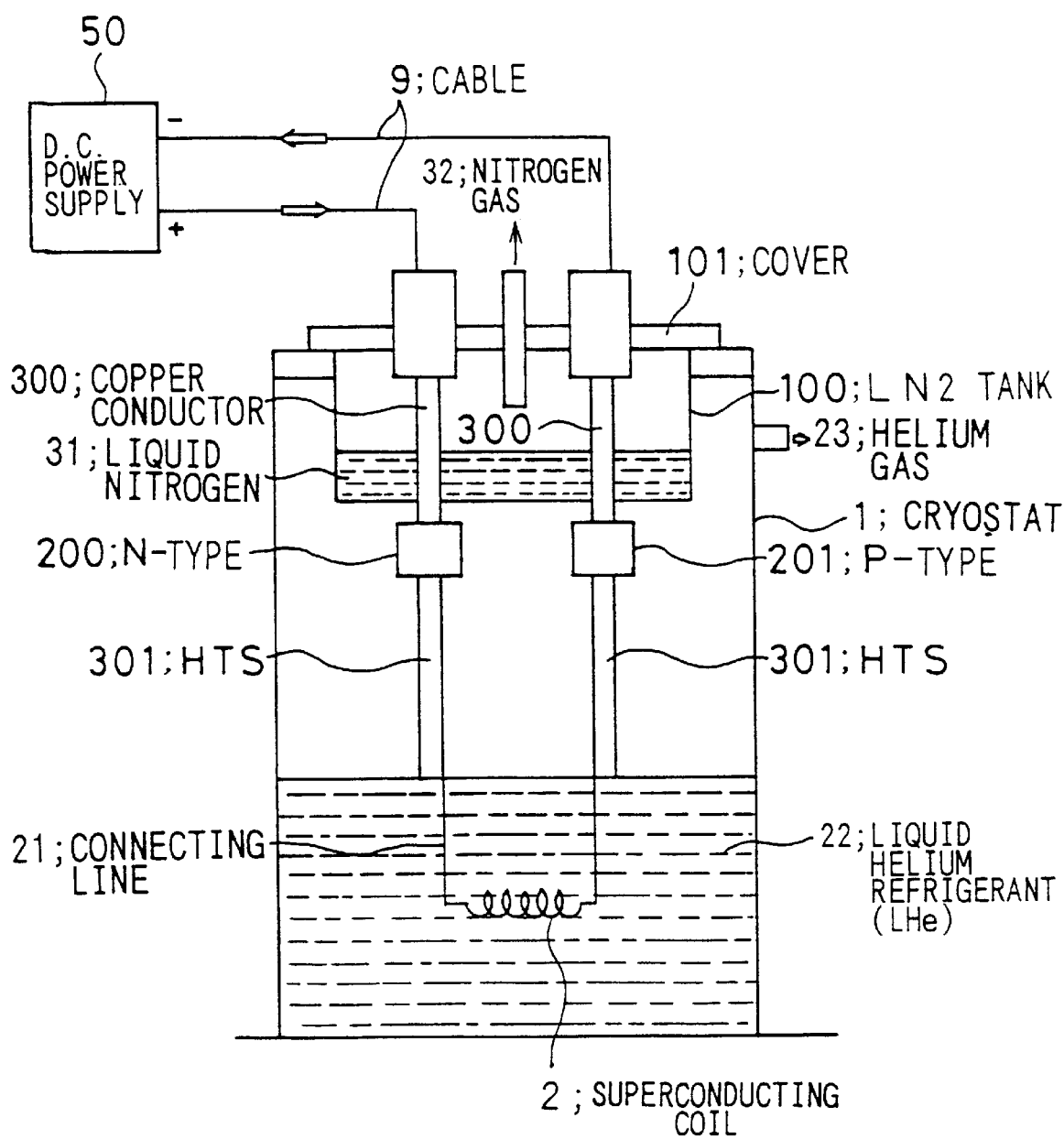
FIG. 14 shows the structure of the tenth embodiment of the present invention.

Referring to FIG. 14, in case that a strand forming the superconducting coil 2 is made up of a high temperature superconducting material, it suffices that the superconducting coil 2 is cooled before 77° K. so that the liquid helium 22 functioning as a refrigerant is not needed and the high temperature superconducting member 301 provided in the power lead is not needed, as a result of which the N-type and P-type thermoelectric members 200 and 201 are provided between both and terminals of superconducting coil 2 and the copper conductor 300 to realize a simple structured version of a superconducting coil device.

Embodiment 11

The eleventh embodiment of the present invention is described below with reference to FIG. 15. In the above mentioned embodiment 10 shown in FIG. 14, power lead 3 are cooled by the N-type and P-type thermoelectric members 200 and 201 and an amount of heat flux penetrating into the low temperature region is reduced when the superconducting coil 2 is excited. However, when the current through the superconducting coil 2 becomes zero, there is no current flowing through the N-type and P-type thermoelectric members 200 and 201, and hence no cooling is executed by the Pertier device. The present embodiment is developed to resolve this problem with a configuration described below.

Figure 15:
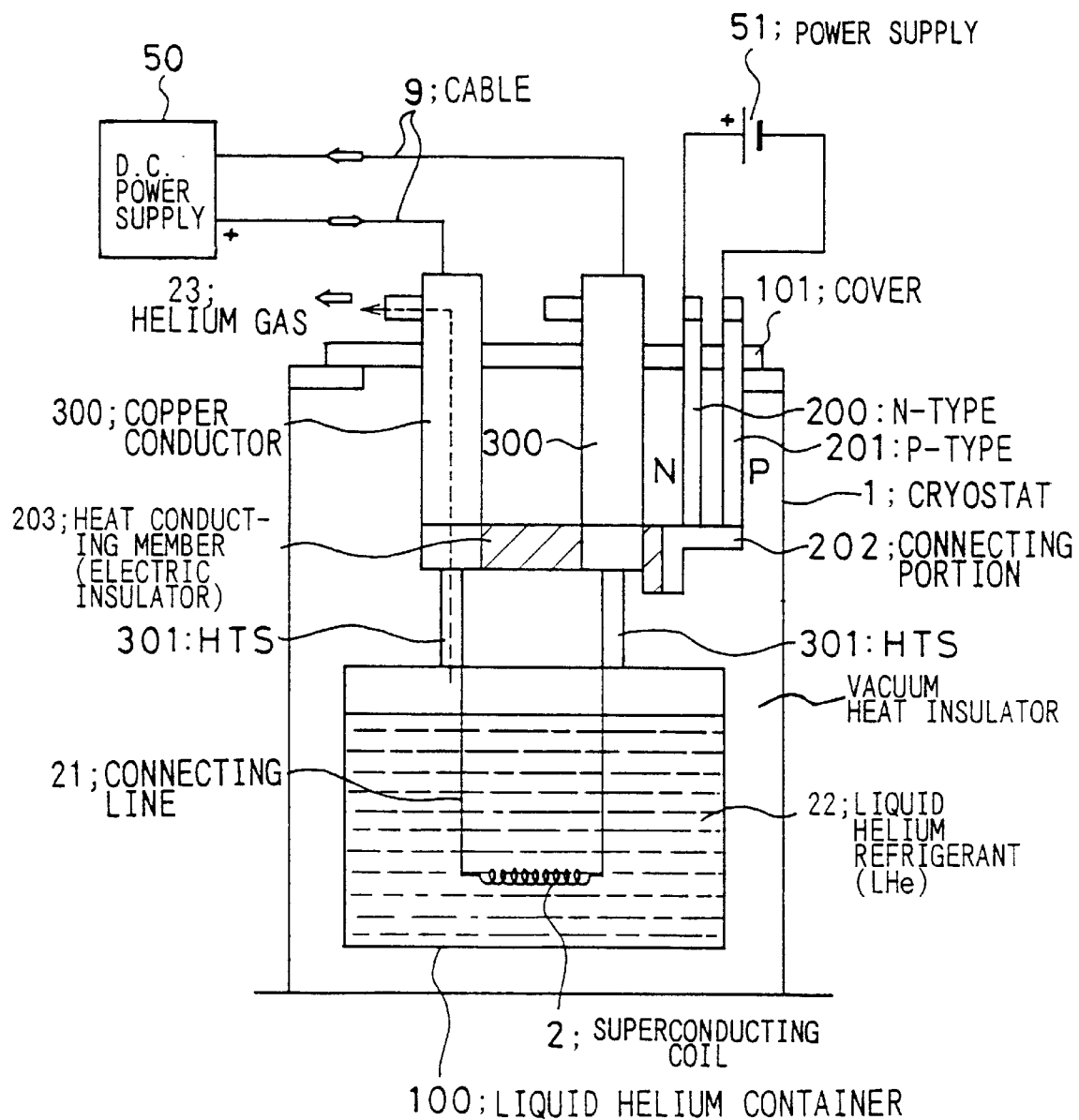
FIG. 15 shows the structure of the eleventh embodiment of the present invention.

In FIG. 15, the same components of the components having the same functions as those of embodiment 10 shown in FIG. 14 are denoted by the same reference numbers. In the following the difference between the present embodiment and embodiment 10 is described.

A superconducting coil 2 is housed in a liquid helium tank 100 contained within a cryostat 1. The superconducting coil 2 is electrically connected to a high temperature superconducting members 301 through connecting wires 21 and further to copper conductors 300.

One ends of copper conductors 300 on a side of a room temperature are connected to one ends of cables 9 respectively, other ends of which are connected to terminals of a power supply 50. Cover 101 seals cryostat 1 to keep an inside in a vacuum. Copper conductors 300 are supported by the cover 101 of the cryostat.

In the present embodiment the low temperature side of the copper conductors 300 are connected, through an electric insulator 203 with a high thermal conductivity, to a junction 202 of N-type and P-type thermoelectric members 200 and 201 forming a thermoelectric cooling device as shown in FIG. 15. Thermoelectric cooling device (200 and 201) is connected to a positive side of a power supply 51 through the N-type thermoelectric member 200 and to a negative side of the power supply 51 through the P-type thermoelectric member 201. The thermoelectric device is supported and sealed on cover 101.

The thermoelectric cooling device (200 and 201) is electrically connected to the power supply through cables. With the power lead of the present embodiment, copper conductors 300 and high temperature superconducting members 301 form conductors which may have a through hole, and a helium gas 23 produced by an evaporation of a liquid helium 22 may pass through an inside of the conductors to cool the conductors as shown in FIG. 15.

A strand of a superconducting coil 2 may be either metal superconducting strand or a high temperature superconducting strand. A cryogen is a liquid helium for the former and a liquid nitrogen for the latter.

While various embodiments of the present invention have been described above, it should be understand that they have been presented by way of examples only, and do not constitute limitations. Thus, the breadth and scope of the present invention should not be limited by any of the above-described exemplary embodiments and their combinations.

It should be noted that any modification from the embodiments may be done without departing from the gist of the present invention within the concept and scope to disclosed herein and claimed hereinabove.

What is claimed is:

1. A power lead electrically connecting a superconducting coil with a power supply, comprising thermoelectric cooling means, said means including at least an N-type thermoelectric member and a P-type thermoelectric member, being electrically connected to a positive side and a negative side of said power supply, respectively.

2. A power lead electrically connecting a superconducting coil with a power supply, comprising:
   a thermoelectric cooling means, said means including at least an N-type thermoelectric member and a P-type thermoelectric member, being electrically connected to a positive side and a negative side of said power supply respectively; and
   a high temperature superconducting member being located between said thermoelectric cooling means and said superconducting coil.

3. A power lead electrically connecting a superconducting coil with a power supply, comprising:
   a thermoelectric cooling means, said means including at least an N-type thermoelectric member and a P-type thermoelectric member, being electrically connected to a positive side and a negative side of said power supply respectively,
   conductors, made up of a metal or a semiconductor, each of said conductors being connected to one end of said thermoelectric cooling means;
   a high temperature superconducting member being accommodated between said conductors and said superconducting coil.

4. The power lead as defined in claim 1 or 2, wherein a plurality of said thermoelectric cooling means, each of said thermoelectric cooling means comprising an N-type thermoelectric member and a P-type thermoelectric member, are connected in series.

5. The power lead as defined in claim 1 or 2, wherein a plurality of modules, each of said modules being made up of a plurality of said thermoelectric cooling means connected in series, each of said thermoelectric cooling means including an N-type thermoelectric member and a P-type thermoelectric member, are configured in a plurality of stages in a cascade connection.

6. A power lead electrically connecting a superconducting coil with an AC power supply, comprising:
   a first and second thermoelectric cooling means, each of said means including a pair of an N-type thermoelectric member and a P-type thermoelectric member;
   a first switch provided between one terminal of said AC power supply and said first thermoelectric cooling means; and
   a second switch provided between an other terminal of said AC power supply and said second thermoelectric cooling means;
   said superconducting coil being accommodated on a side facing one end of said first and second thermoelectric cooling means, said side being in an opposite direction against a side facing said AC power supply;
   wherein said first and second switches are changed in response in a power line frequency so that said N-type thermoelectric members and said p-type thermoelectric members of said first and second thermoelectric cooling means are arranged in an upper stream and a down stream respectively to drive said superconducting coil in an alternating current mode.

7. The power lead as defined in claim 6, further comprising a plurality of high temperature superconducting members provided between said first and second thermoelectric cooling means and said superconducting coil respectively.

8. The power lead as defined in claim 6, wherein a plurality of said thermoelectric cooling means, each of said thermoelectric cooling means including an N-type thermoelectric member and a P-type thermoelectric member, are connected in series to each of said first and second thermoelectric cooling means.

9. A power lead electrically connecting a superconducting coil with a first power supply, comprising:
   a first and second thermoelectric cooling means, each of said means including a pair of an N-type thermoelectric member and a P-type thermoelectric member;
   said N-type and P-type thermoelectric members of said first and second thermoelectric cooling means being electrically connected in common on one end facing said superconducting coil, said ends being electrically connected to associated ends of said superconducting coil;
   second power supplies connected to said first and second thermoelectric cooling means on a side of facing said first power supply to provide a positive voltage to said N-type thermoelectric member against said P-type thermoelectric member; and
   a means for monitoring currents flowing through said superconducting coil and said first and second thermoelectric cooling means to control said first and second power supplies for providing an optimum cooling.

10. The power lead as defined in claim 9, further comprising high temperature superconducting members connected between said superconducting coil and each of said first and second thermoelectric cooling means.

11. The power lead as defined in claim 9, wherein a plurality of thermoelectric cooling means, each of said means including an N-type thermoelectric member and a P-type thermoelectric member, are connected in series to said first and second thermoelectric cooling means respectively.

12. A power lead electrically connecting a superconducting coil with a power supply, comprising a thermoelectric cooling means including at least an N-type and a P-type thermoelectric members connected to a positive and a negative sides of said power supply, respectively,
   said N-type and P-type thermoelectric members being connected in common via an electric insulator having a high thermal conductivity, on a predetermined region including ends of said N-type and P-type thermoelectric members, said ends being opposite to said power supply.

13. The power lead as defined in claim 12, further comprising a high temperature superconducting members connected between said superconducting coil and said thermoelectric cooling means.

14. The power lead as defined in claim 12, wherein a plurality of thermoelectric cooling means, each of said means comprising an N-type thermoelectric member and a P-type thermoelectric member, are connected in series.

15. A power lead electrically connecting a superconducting coil with a first power supply, comprising:
   a plurality of thermoelectric cooling means, each of said means including at least a pair of an N-type thermoelectric member and a P-type thermoelectric member; and a plurality of second power supplies;

said pair of said N-type and P-type thermoelectric members of said plurality of thermoelectric cooling means being connected in common at one end to be connected to said superconducting coil for magnetization, and on other end opposite to said superconducting coil being connected to said first and/or second power power supplies through a group of switches;

wherein during a time period for exciting said superconducting coil for magnetization, said N-type and P-type thermoelectric members are connected in parallel to feed a current to said superconducting coil at least from said first power supply and during a time period when said superconducting coil is not excited, said group of switches are switched to change connections to configure plurality of thermoelectric cooling means in series for reducing a current flowing said second power supply.

16. A power lead electrically connecting a superconducting coil with a power supply, comprising:

a thermoelectric cooling means including at least an N-type thermoelectric member and a P-type thermoelectric member being connected to a positive side and a negative side of said power supply respectively;

conductors, made up of meal of a semiconductor, one end of said conductors being connected to said thermoelectric cooling means;

a high temperature superconducting member accommodated between said conductor and said superconducting coil; and a switch for electrically connecting said conductors, said conductors being connected to said N-type and P-type thermoelectric members;

wherein said switch is controlled to be open when exciting said superconducting coil for magnetization and closed when said superconducting coil being not excited.

17. A power lead providing an electric current from an external power supply to a superconducting coil immersed in a liquid helium contained in a vacuum cryostat, comprising metal conductors cooled with a liquid nitrogen, and an N-type thermoelectric member and a P-type thermoelectric member, each of said members being connected to said metal conductors, respectively, placed in this order from a room temperature side.

18. The power lead as defined in claim 17, wherein an electrically conducting member made up of a high temperature superconducting material is provided between said N-type and P-type thermoelectric members and said superconducting coil.

* * * * *